(12) United States Patent
Nozaki et al.

(10) Patent No.: US 7,799,508 B2
(45) Date of Patent: Sep. 21, 2010

(54) RESIST PATTERN THICKENING MATERIAL AND PROCESS FOR FORMING RESIST PATTERN, AND SEMICONDUCTOR DEVICE AND PROCESS FOR MANUFACTURING THE SAME

(75) Inventors: Koji Nozaki, Kawasaki (JP); Miwa Kozawa, Kawasaki (JP); Takahisa Namiki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/453,590

(22) Filed: May 15, 2009

(65) Prior Publication Data

US 2009/0226844 A1  Sep. 10, 2009

Related U.S. Application Data

(63) Continuation of application No. 11/335,716, filed on Jan. 20, 2006, now Pat. No. 7,585,610, which is a continuation-in-part of application No. 11/138,819, filed on May 27, 2005, now abandoned.

(30) Foreign Application Priority Data

Feb. 18, 2005  (JP) .............................. 2005-042884
Dec. 20, 2005  (JP) .............................. 2005-366991

(51) Int. Cl.
*G03F 7/00* (2006.01)
*G03F 7/004* (2006.01)

(52) U.S. Cl. ................. 430/270.1; 430/273.1; 430/905; 430/913

(58) Field of Classification Search ............. 430/270.1, 430/273.1, 905, 913
See application file for complete search history.

(56) References Cited

U.S. PATENT DOCUMENTS 5,010,134 A   4/1991   Chang et al.
5,120,531 A   6/1992   Wells et al.
5,650,173 A   7/1997   Ramstack et al.

(Continued)

FOREIGN PATENT DOCUMENTS

EP    0 004 014 A2   9/1979

(Continued)

OTHER PUBLICATIONS

Takeo Ishibashi et al.; "Advanced Micro-Lithography Process with Chemical Shrink Technology", Japan J. Appl. Phys. vol. 40, Part 1, No. 1, Jan. 2001, pp. 419-425.

(Continued)

*Primary Examiner*—Amanda C. Walke
(74) *Attorney, Agent, or Firm*—Westerman, Hattori, Daniels & Adrian, LLP

(57) ABSTRACT

The present invention provides a resist pattern thickening material, which can utilize ArF excimer laser light; which, when applied over a resist pattern to be thickened e.g., in form of lines and spaces pattern, can thicken the resist pattern to be thickened regardless of the size of the resist pattern to be thickened; and which is suited for forming a fine space pattern or the like, exceeding exposure limits. The present invention also provides a process for forming a resist pattern and a process for manufacturing a semiconductor device, wherein the resist pattern thickening material of the present invention is suitably utilized.

24 Claims, 18 Drawing Sheets

U.S. PATENT DOCUMENTS

| | | |
|---|---|---|
| 5,843,930 A | 12/1998 | Purwar et al. |
| 5,858,620 A | 1/1999 | Ishibashi et al. |
| 6,319,853 B1 | 11/2001 | Ishibashi et al. |
| 6,555,607 B1 | 4/2003 | Kanda et al. |
| 6,579,657 B1 | 6/2003 | Ishibashi et al. |
| 6,641,961 B2 | 11/2003 | Takebe |
| 2003/0039921 A1 | 2/2003 | Washio et al. |
| 2003/0157801 A1 | 8/2003 | Kozawa et al. |
| 2004/0106737 A1 | 6/2004 | Sugeta et al. |
| 2005/0175927 A1 | 8/2005 | Kishioka et al. |

FOREIGN PATENT DOCUMENTS

| | | |
|---|---|---|
| EP | 1 343 052 A2 | 9/2003 |
| EP | 1 403 717 A1 | 3/2004 |
| EP | 1 429 185 A1 | 6/2004 |
| JP | 62-20540 B2 | 5/1987 |
| JP | 5-197151 A | 8/1993 |
| JP | 5-241348 A | 9/1993 |
| JP | 10-73927 A | 3/1998 |
| JP | 11-204399 A | 7/1999 |
| JP | 3057879 B2 | 4/2000 |
| JP | 2000-267268 A | 9/2000 |
| JP | 2000-347414 A | 12/2000 |
| JP | 2001-19860 A | 1/2001 |
| JP | 2001-033984 A | 2/2001 |
| JP | 2001-228616 A | 8/2001 |
| JP | 2002-6491 A | 1/2002 |
| JP | 2002-6512 A | 1/2002 |
| JP | 2002-23389 A | 1/2002 |
| JP | 2002-49161 A | 2/2002 |
| JP | 2003-84457 A | 3/2003 |
| JP | 2003-131400 A | 5/2003 |
| JP | 2004-53723 A | 2/2004 |
| KR | 2003-11524 A | 2/2003 |

OTHER PUBLICATIONS

Mamoru Terai et al.; "Below 70-nm Contact Hole Pattern with RELACS Process on ArF Resist", Proceedings of SPIE, vol. 5039, 2003, pp. 789-797.

European Search Report dated Mar. 22, 2006 issued in corresponding European Application No. 06 00 1201.

Korean Office Action dated Feb. 27, 2008 of corresponding Korean Application.

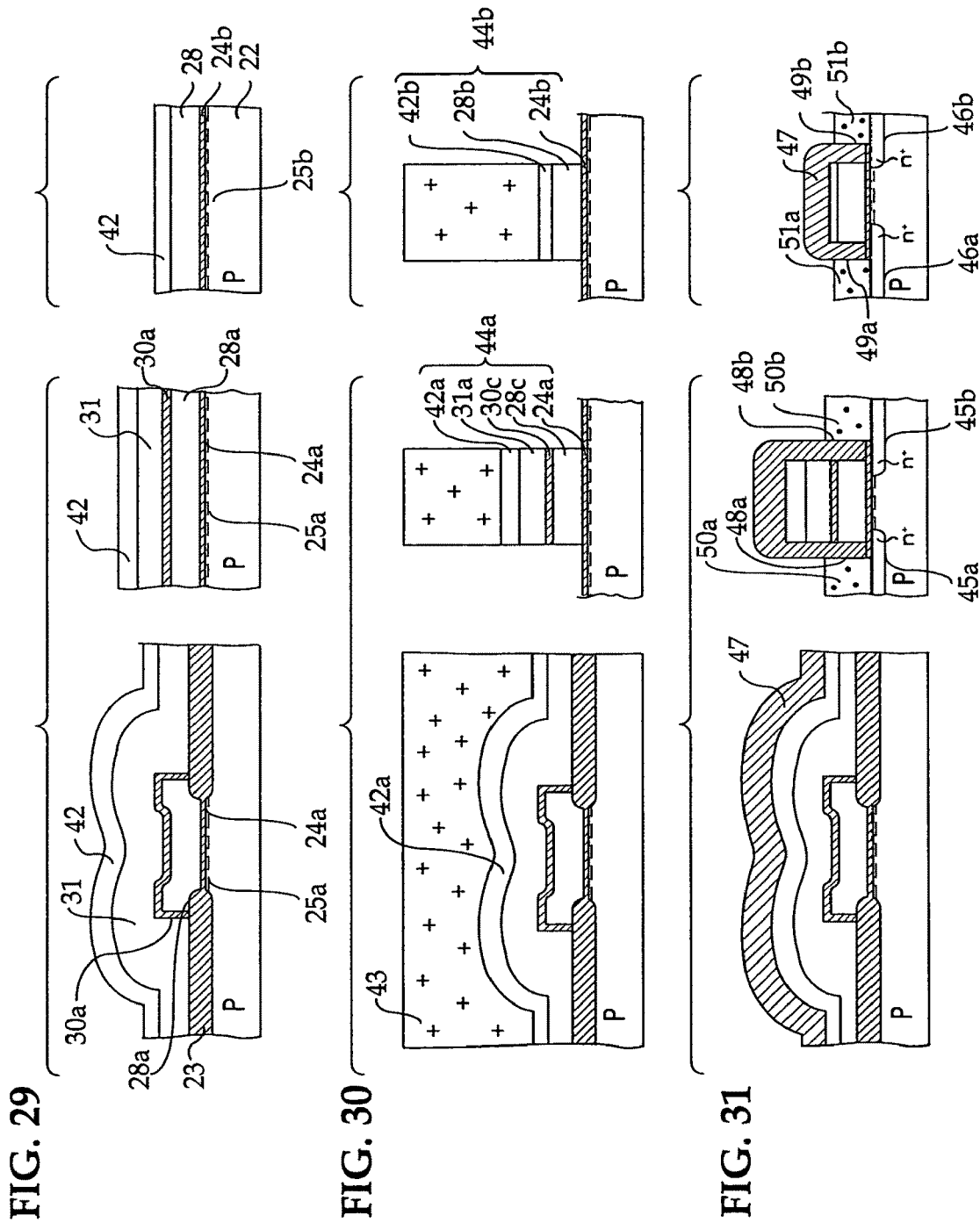

RESIST PATTERN THICKENING MATERIAL AND PROCESS FOR FORMING RESIST PATTERN, AND SEMICONDUCTOR DEVICE AND PROCESS FOR MANUFACTURING THE SAME

This is a Continuation application of application Ser. No. 11/335,716, filed Jan. 20, 2006, which is a Continuation-in-part (CIP) of application Ser. No. 11/138,819, filed May 27, 2005, now abandoned.

CROSS-REFERENCE TO RELATED APPLICATIONS

This application is based upon and claims the benefits of the priority from the prior Japanese Patent Application No. 2005-042884, filed on Feb. 18, 2005 and Japanese Patent Application No. 2005-366991, filed on Dec. 20, 2005, the entire contents of which are incorporated herein by reference.

BACKGROUND OF THE INVENTION

1. Field of the Invention

The present invention relates to a resist pattern thickening material, which is applied over a resist pattern that is formed in manufacturing a semiconductor device and is capable of thickening the resist pattern, and which may form a fine space pattern that exceeds exposure limits of light sources of available exposure devices. The present invention also relates to a process for forming a resist pattern, a semiconductor device, and a process for manufacturing the semiconductor device that utilize the resist pattern thickening material respectively.

2. Description of the Related Art

Semiconductor integrated circuits are becoming more highly integrated, and LSIs and VLSIs are being put into practical use. Accompanying this trend, the wiring patterns extend to regions of 0.2 µm or less, and the smallest patterns extend to regions of 0.1 µm or less. A lithographic technique is extremely important in forming fine wiring patterns. In the lithographic technique, a substrate to be processed on which a thin film is formed, is coated by a resist film, is selectively exposed, and thereafter, is developed to thereby form a resist pattern. Dry etching is carried out by using the resist pattern as a mask, and thereafter, by removing the resist pattern, the desired pattern is obtained. In forming a fine wiring pattern utilizing the lithographic technique, it is necessary to make the light source of the exposure device be a short wavelength, as well as to develop resist materials which have high resolution and is suitable to the characteristics of the light source.

However, in order to make a light source of an exposure device be a short wavelength, it is necessary to improve the exposure device, which results in very high costs. Further, the development of new resist materials suitable for an exposure with light of short wavelength is not easy.

To overcome the above technical problems, there has been proposed a technique wherein a resist pattern formed of a conventional resist material is formed and thickened by using a resist pattern thickening material (hereinafter, the resist pattern thickening material being sometimes referred to as "resist swelling material") capable of forming a fine space pattern. For instance, Japanese Patent Application Laid-Open (JP-A) No. 10-73927 discloses a technique called RELACS. According to the disclosure, resist patterns are formed by exposing a resist of positive resist or negative resist using KrF (krypton fluoride) excimer laser light of wavelength 248 nm which is deep ultraviolet light as the exposure light. Thereafter, by means of a water-soluble resin composition, a coated film is provided so as to cover the resist pattern. The coated film and the resist pattern are made to interact at the interface thereof using the residual acid within the material of the resist pattern, and the resist pattern is thickened (hereinafter, the thickening of the resist pattern being sometimes referred to as "swelling"). In this way, the distance between the resist patterns is shortened, and a fine space pattern is formed. Thereafter, a desired pattern (e.g. wiring pattern) having the same dimension as the space pattern is formed.

In the RELACS technique, however, there is the following problems. The KrF resist for use is formed of an aromatic resin composition including a novolak resin, naphthoquinonediazide resin or the like. An aromatic ring contained in the aromatic resin composition allows KrF excimer laser light (wavelength: 248 nm) to pass through, but absorbs ArF excimer laser light (wavelength: 193 nm) having a shorter wavelength than the KrF excimer laser light and does not allow the ArF excimer laser light to pass through. Therefore, when the KrF resist is used, ArF excimer laser light cannot be used as the exposure light, which makes it impossible to from a finer wiring pattern, etc. Moreover, there is a problem in the RELACS technique that the resist swelling material is effective for thickening or swelling the KrF resist but not for thickening or swelling the ArF resist. In addition, the resist swelling material has low etch resistance itself. Thus, when ArF resist pattern having low etch resistance is swelled, the same dimension as the swelled pattern cannot be patterned on the substrate to be processed. Furthermore, even if KrF resist having relatively satisfactory etch resistance is swelled, in such cases where etching condition is severe, where the KrF resist pattern is fine, where the resist film is thin, or the like, there is a problem that etching cannot be precisely carried out and pattern having the same dimension as the swelled pattern cannot be obtained.

From the standpoint of forming a fine wiring pattern, it is desirable to be able to use light of a shorter wavelength than KrF excimer laser light, e.g., ArF excimer laser light, as the light source of the exposure device. In case x-ray or electron beam having a shorter wavelength than the ArF excimer laser light is used as exposure light of the resist to form the pattern, however, it results in high cost and low productivity. Thus, the utilization of ArF excimer laser light is desired.

As mentioned above, in the RELACS technique, the aforementioned resist swelling material does not efficiently work on ArF resist pattern. The present inventors have proposed a resist pattern thickening material capable of forming a fine pattern by improving affinity with the ArF resist pattern caused by a surfactant (JP-A No. 2003-131400). However, the composition of this resist pattern thickening material sometimes causes dependency on the pattern size before thickening, that is, when the pattern size before thickening increases, the reduced amount of the pattern size after thickening may increase in proportion to the increase. Thus, there was a problem that when the resist pattern thickening material was used for a line-space pattern, on a wiring layer of LOGIC LSI where various sizes of resist patterns are utilized, the burden on designing an exposure mask could not fully be alleviated.

Accordingly, the current situation is that there has not yet been developed a technique which can use ArF excimer laser light as the light source of an exposure device during patterning, which can sufficiently thicken ArF resist pattern or the like that cannot be thickened by using the aforementioned resist swelling material used in the RELACS technique, and which can easily form a fine space pattern or a wiring pattern at low cost. Therefore, it is desired that such technique be developed.

An object of the present invention is to provide a resist pattern thickening material, which can utilize ArF excimer laser light as exposure light during patterning; which, when applied over a resist pattern to be thickened, can efficiently thicken the resist pattern to be thickened, e.g., in form of lines and spaces pattern, regardless of the size of the resist pattern to be thickened; which has high etch resistance; and which is suited for forming a fine space pattern of resist, exceeding exposure limits or resolution limits of light sources of available exposure devices at low cost, easily and efficiently.

Another object of the present invention is to provide a process for forming a resist pattern which, during patterning a resist pattern to be thickened, can utilize ArF excimer laser light as a light source; which can thicken a resist pattern to be thickened, e.g., in form of lines and spaces pattern, regardless of the size of the resist pattern; and which is suited for forming a fine space pattern of resist, exceeding exposure limits or resolution limits of light sources of available exposure devices at low cost, easily and efficiently.

Yet another object of the present invention is to provide a process for manufacturing a semiconductor device in which, during patterning a resist pattern to be thickened, ArF excimer laser light can be utilized as a light source; a fine space pattern of resist, exceeding exposure limits or resolution limits of light sources of available exposure devices, can be formed; and high-performance semiconductor devices having fine wiring patterns formed by using the space pattern of resist can be efficiently mass produced, and is to provide a high-performance semiconductor which is manufactured by the process for manufacturing a semiconductor device and has fine wiring patterns.

SUMMARY OF THE INVENTION

In view of the above-mentioned problems, inventors of the present invention have investigated vigorously, and have found the following experiences or discoveries. Specifically, when a resist pattern is swelled using a conventional resist swelling material, it was impossible to thicken the resist pattern without utilizing residual acid. However, they have found that when a resin, benzyl alcohol, benzylamine, derivatives thereof, and the like are used as a composition of the resist pattern thickening material, the reaction can be easily controlled because crosslinking reaction does not occur, and resist patterns can be thickened without depending on the sizes thereof. In addition, they have found that since the benzyl alcohol or the like has an aromatic ring at a portion of its structure, a resist pattern thickening material having high etch resistance can be obtained, and have accomplished the present invention.

The present invention is based on such experiences or discoveries; how to solve aforesaid problems is described in attached claims.

The resist pattern thickening material of the present invention includes a resin and a compound represented by the general formula (1):

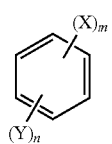

General Formula (1)

where, "X" is a functional group represented by the following structural formula (1). "Y" represents at least any one of a hydroxyl group, an amino group, an amino group substituted by an alkyl group, an alkoxy group, an alkoxycarbonyl group and an alkyl group, and the number of the substitution is an integer of 0 to 3. "m" represents an integer of 1 or more and "n" represents an integer of 0 or more:

Structural Formula (1)

where, "$R^1$" and "$R^2$" may be the same or different, and each represent a hydrogen atom or a substituent group. "Z" represents at least any one of a hydroxyl group, an amino group, an amino group substituted by an alkyl group, and an alkoxy group, and the number of the substitution is an integer of 0 to 3.

When the resist pattern thickening material is applied over a resist pattern to be thickened, the portions of the applied resist pattern thickening material in a vicinity of the interface with the resist pattern to be thickened infiltrate into the resist pattern and cause an interaction, i.e., mixing, with the material of the resist pattern to be thickened. Then, because the affinity is high between the resist pattern thickening material and the resist pattern to be thickened, a surface layer or mixing layer, where the resist pattern thickening material and the resist pattern are mixed, is efficiently formed on the surface of the resist pattern as the inner layer. As a result, the resist pattern to be thickened is efficiently thickened by the resist pattern thickening material. The resist pattern thickened in this way (hereinafter sometimes referring to as "thickened resist pattern") is thickened uniformly by the resist pattern thickening material. Thus, the space pattern of resist formed by the thickened resist pattern a fine space pattern of resist has a fine structure, exceeding exposure limits or resolution limits. The term "space pattern" is hereby defined as a hole, trench, recess, or any other empty space that is formed by developing a resist. Since the resist pattern thickening material of the present invention includes the compound represented by the general formula (1), uniform thickening effect is derived without being affected by the types of resist material or sizes of the resist pattern. Further, since the compound represented by the general formula (1) includes an aromatic ring, the resist pattern thickening material of the present invention has high etch resistance. Thus, the resist pattern thickening material of the present invention can be suitably utilized for forming a resist pattern, such as a lines and spaces pattern, on a wiring layer of LOGIC LSI where various sizes of resist patterns are utilized.

The process for forming a resist pattern of the present invention includes forming a resist pattern to be thickened, and then applying a resist pattern thickening material of the present invention so as to cover the surface of the resist pattern to be thickened. In the process for forming a resist pattern of the present invention, a resist pattern to be thickened is formed and then, when the resist pattern thickening material is applied over the resist pattern to be thickened, the portions of the applied resist pattern thickening material in a vicinity of the interface with the resist pattern to be thickened infiltrate into the resist pattern and cause an interaction or mixing with the material of the resist pattern. Thus, a surface layer or mixing layer, where the resist pattern thickening material and the resist pattern are mixed, is formed on the surface of the resist pattern as the inner layer. The resulting thickened resist pattern is uniformly thickened by the resist pattern thickening material. Thus, the space pattern of resist formed by the thickened resist pattern a fine space pattern of resist has a fine structure, exceeding exposure limits or resolution limits. Since the resist pattern thickening material includes the compound represented by the general formula (1), uniform thickening effect is derived without being affected by the types of resist material or sizes of the resist pattern. Further, the aromatic ring in the compound represented by the general formula (1) provides high etch resistance. Thus, the process for forming a resist pattern can be suitably utilized for forming a resist pattern, such as a line-space pattern, on a wiring layer of LOGIC LSI where not only a contact hole pattern, but also various sizes of resist patterns are utilized.

The process for manufacturing a semiconductor device of the present invention includes a step of forming a thickened resist pattern on a surface of a workpiece using the process for forming a resist pattern of the present invention, namely, a step of forming a thickened resist pattern by forming a resist pattern to be thickened on a surface of a workpiece, and then by applying a resist pattern thickening material so as to cover the surface of the resist pattern to be thickened; and a step of patterning the surface of the workpiece by etching the surface of the workpiece using the thickened resist pattern as a mask. In the process for manufacturing a semiconductor device, initially, in the step of forming a thickened resist pattern, a resist pattern to be thickened is formed on the surface of the workpiece serving as a subject on which wiring patterns, etc. is formed, and then the resist pattern thickening material of the present invention is applied so as to cover the surface of the resist pattern to be thickened. Then, the portions of the applied resist pattern thickening material in a vicinity of the interface with the resist pattern to be thickened infiltrate into the resist pattern and cause an interaction or mixing with the material of the resist pattern. Thus, a surface layer or mixing layer, where the resist pattern thickening material and the resist pattern are mixed, is formed on the surface of the resist pattern as the inner layer. The resulting thickened resist pattern is uniformly thickened by the resist pattern thickening material. Thus, the space pattern of resist formed by the thickened resist pattern has a fine structure, exceeding exposure limits or resolution limits. Since the resist pattern thickening material includes the compound represented by the general formula (1), uniform thickening effect is derived without being affected by the types of resist material or sizes of the resist pattern. Further, the aromatic ring in the compound represented by the general formula (1) provides high etch resistance. Thus, thickened resist patterns such as a line-space pattern, on a wiring layer of LOGIC LSI where not only a contact hole pattern, but also various sizes of resist patterns are utilized, can be formed easily and precisely.

In the step of patterning, by etching the surface of the workpiece using the thickened resist pattern formed by the step of forming a thickened resist pattern as a mask, the surface of the workpiece is patterned finely and precisely with accurate dimension, thus high-quality and high performance semiconductor devices can be produced efficiently having a wiring pattern with fine, precise, and accurate dimension.

The semiconductor device of the present invention is manufactured by the process for manufacturing a semiconductor device of the present invention. The semiconductor device has patterns, for example, wiring patterns, with fine, precise, and accurate dimension, and is high quality and high performance.

BRIEF DESCRIPTION OF THE DRAWINGS

FIG. 29 is a cross-sectional schematic diagram for explaining the process for manufacturing the FLASH EPROM which is another example of the process for manufacturing a semiconductor device of the present invention.

FIG. 30 is a cross-sectional schematic diagram for explaining the process for manufacturing the FLASH EPROM which is another example of the process for manufacturing a semiconductor device of the present invention, and showing a step after the step shown in FIG. 29.

FIG. 31 is a cross-sectional schematic diagram for explaining the process for manufacturing the FLASH EPROM which is another example of the process for manufacturing a semiconductor device of the present invention, and showing a step after the step shown in FIG. 30.

Figure 1:
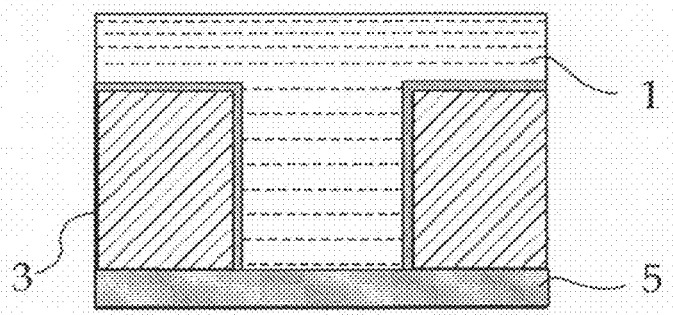
FIG. 1 is a schematic diagram for explaining one example of the mechanism of thickening a resist pattern to be thickened by using a resist pattern thickening material of the present invention, and showing the state where the resist pattern thickening material is applied over the surface of the resist pattern to be thickened.

DESCRIPTION OF THE PREFERRED EMBODIMENTS (Resist Pattern Thickening Material)

The resist pattern thickening material of the present invention comprises at least a resin and a compound represented by the following general formula (1), and may further comprise a surfactant, a phase transfer catalyst, a water-soluble aromatic compound, a resin containing an aromatic compound in a portion thereof, an organic solvent and other components suitably selected according to necessity.

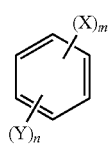

General Formula (1)

In the general formula (1), "X" is a functional group represented by the following structural formula (1). "Y" represents at least any one of a hydroxyl group, an amino group, an amino group substituted by an alkyl group, an alkoxy group, an alkoxycarbonyl group and an alkyl group, and the number of the substitution is an integer of 0 to 3. "m" represents an integer of 1 or more and "n" represents an integer of 0 or more.

Structural Formula (1)

In the structural formula (1), "$R^1$" and "$R^2$" may be the same or different, and each represent a hydrogen atom or a substituent group. "Z" represents at least any one of a hydroxyl group, an amino group, an amino group substituted by an alkyl group, and an alkoxy group, and the number of the substitution is an integer of 0 to 3.

The resist pattern thickening material of the present invention is water-soluble or alkali-soluble.

The water-solubility of the resist pattern thickening material is not particularly limited and suitably adjusted according to the purpose, but it is preferable that the resist pattern thickening material dissolves 0.1 g or more in 100 g of water at a water-temperature of 25° C.

The alkali-solubility of the resist pattern thickening material is not particularly limited and suitably adjusted according to the purpose, but it is preferable that the resist pattern thickening material dissolves 0.1 g or more in 100 g of a 2.38% by mass tetramethyl ammonium hydroxide (TMAH) aqueous solution at a solution temperature of 25° C.

The resist pattern thickening material of the present invention may be an aqueous solution, a colloid liquid, an emulsion liquid or the like, but an aqueous solution is preferable.

—Resin—

The resin is not particularly limited, and can be appropriately selected according to the purpose. However, it is preferable that the resin is water-soluble or alkali-soluble.

The resin preferably comprises two or more polar groups in view of exhibiting an excellent water-solubility or alkali-solubility.

The polar group is not particularly limited and can be appropriately selected according to the purpose. Preferable examples thereof are a hydroxyl group, an amino group, a sulfonyl group, a carbonyl group, a carboxyl group, derivatives thereof, and the like. The polar group may be contained singly, or two or more may be contained in combination.

When the resin is water-soluble, the water-soluble resin preferably exhibits water solubility of 0.1 g or more in 100 g of water at a water temperature of 25° C.

Examples of the water-soluble resin include polyvinyl alcohol, polyvinyl acetal, polyvinyl acetate, polyacrylic acid, polyvinyl pyrolidone, polyethyleneimine, polyethylene oxide, styrene-maleic acid copolymer, polyvinylamine, polyallylamine, an oxazoline group-containing water-soluble resin, a water-soluble melamine resin, a water-soluble urea resin, an alkyd resin, a sulfonamide resin, and the like.

When the resin is alkali-soluble, the alkali-soluble resin preferably exhibits alkali solubility of 0.1 g or more in 100 g of a 2.38% by mass tetramethyl ammonium hydroxide (TMAH) aqueous solution at a solution temperature of 25° C.

Examples of the alkali-soluble resin are novolak resins, vinylphenol resins, polyacrylic acids, polymethacrylic acids, poly p-hydroxyphenylacrylate, poly p-hydroxyphenylmethacrylate, copolymer thereof, and the like.

The resin may be used singly, or two or more thereof may be used in combination. Among these, polyvinyl alcohol, polyvinyl acetal, polyvinyl acetate or the like is preferred. It is more preferable that the resin contains the polyvinyl acetal at 5% by mass to 40% by mass.

In the present invention, the resin may be a resin having a cyclic structure at least at a portion thereof, and use of such resins has an advantage that high etch resistance can be imparted to the resist pattern thickening material.

In the present invention, the resin having a cyclic structure at least at a portion thereof may be used singly, and two or more may be used in combination. Moreover, it may be used together with the resins.

The resin having a cyclic structure at a portion thereof is not particularly limited and can be appropriately selected according to the purpose. Suitable examples thereof include polyvinyl aryl acetal resins, polyvinyl aryl ether resins, polyvinyl aryl ester resins, and derivatives thereof. It is preferable to use at least one selected therefrom. From the standpoint of exhibiting water solubility or alkali solubility to an appropriate degree, such a resin that contains an acetyl group is more preferable.

The polyvinyl aryl acetal resins are not particularly limited and may be appropriately selected according to the purpose. Examples thereof include β-resorcine acetal and the like.

The polyvinyl aryl ether resins are not particularly limited and may be appropriately selected according to the purpose. Examples thereof include 4-hydroxybenzyl ether and the like.

The polyvinyl aryl ester resins are not particularly limited and may be appropriately selected according to the purpose. Examples thereof include benzoate and the like.

The method of producing the polyvinyl aryl acetal resins is not particularly limited and may be appropriately selected according to the purpose. A suitable example thereof is a known method of producing using a polyvinyl acetal reaction, or the like. Such a producing method is a method in which, for example, polyvinyl alcohol, and aldehyde in an amount needed stoichiometrically for the polyvinyl alcohol are made to undergo an acetalizing reaction in the presence of an acid catalyst. Specifically, suitable examples are the methods disclosed in U.S. Pat. Nos. 5,169,897 and 5,262,270, Japanese Patent Application Laid-Open (JP-A) No. 05-78414, and the like.

The method of producing the polyvinyl aryl ether resins is not particularly limited and may be appropriately selected according to the purpose. Examples thereof are a copolymerization reaction of a corresponding vinyl aryl ether monomer and vinyl acetate; an etherification reaction of polyvinyl alcohol and an aromatic compound having a halogenated alkyl group in the presence of a basic catalyst (Williamson ether synthesis reaction); and the like. Specifically, suitable examples are the methods disclosed in JP-A Nos. 2001-40086, 2001-181383, 06-116194, and the like.

The method of producing the polyvinyl aryl ester resins is not particularly limited and may be appropriately selected according to the purpose. Examples thereof are a copolymerization reaction of a corresponding vinyl aryl ester monomer and vinyl acetate; an esterification reaction of polyvinyl alcohol and an aromatic carboxylic acid halide compound in the presence of a basic catalyst; and the like.

The cyclic structure in the resin having a cyclic structure at a portion thereof, is not particularly limited and may be appropriately selected according to the purpose. Examples thereof are monocyclic structure such as benzene, polycyclic structure such as bisphenol, condensed ring such as naphthalene, specifically, aromatic compounds, alicyclic compounds, heterocyclic compounds, and the like are preferred. In the resin having a cyclic structure at a portion thereof, these cyclic structure may be used singly or two or more thereof may be used in combination.

Examples of the aromatic compound are polyhydroxy phenol compounds, polyphenol compounds, aromatic carboxylic acid compounds, naphthalene polyhydroxy compounds, benzophenone compounds, flavonoid compounds, porphin, water-soluble phenoxy resins, aromatic-containing water-soluble dyes, derivatives thereof, glycosides thereof, and the like. The aromatic compound may be used singly, or two or more may be used in combination.

Examples of the polyhydroxy phenol compounds are resorcinol, resorcin[4]arene, pyrogallol, gallic acid, derivatives and glycosides thereof, and the like.

Examples of the polyphenol compounds include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, and the like.

Examples of the aromatic carboxylic acid compounds include salicylic acid, phthalic acid, dihydroxy benzoic acid, tannin, and the like.

Examples of the naphthalene polyhydroxy compounds include naphthalene diol, naphthalene triol, and the like.

Examples of the benzophenone compounds include alizarin yellow A, and the like.

Examples of the flavonoid compounds include flavone, isoflavone, flavanol, flavonone, flavonol, flavan-3-ol, aurone, chalcone, dihydrochalcone, quercetin, and the like.

Examples of the alicyclic compound are polycycloalkanes, cycloalkanes, fused rings, derivatives and glycosides thereof, and the like. These may be used singly, or two or more may be used in combination.

Examples of the polycycloalkane are norbornane, adamantane, norpinane, sterane, and the like.

Examples of the cycloalkane are cyclopentane, cyclohexane, and the like.

Examples of the fused rings are steroids and the like.

Suitable examples of the heterocyclic compound include a nitrogen-containing cyclic compound such as pyrrolidine, pyridine, imidazole, oxazole, morpholine, pyrrolidone, and the like; and an oxygen-containing cyclic compound such as furan, pyran, saccharides such as pentose and hexose, and the like.

Preferable examples of the resin having a cyclic structure at a portion thereof are ones having at least one selected from the functional groups such as a hydroxyl group, a cyano group, an alkoxyl group, a carboxyl group, an amino group, an amide group, an alkoxycarbonyl group, a hydroxyalkyl group, a sulphonyl group, an acid anhydride group, a lactone group, a cyanate group, and a ketone group etc.; and the saccharic derivatives from the viewpoint of water-solubility. The one having at least one functional group selected from the hydroxyl group, amino group, sulphonyl group, carboxyl group, and their derivatives is more preferable.

The molar content ratio of the cyclic structure in the resin having a cyclic structure at a portion thereof, is not particularly limited as long as it does not affect the etch resistance, and may be appropriately selected according to the purpose. In the case where high etch resistance is needed, it is preferably 5 mol % or more, and more preferably, 10 mol % or more.

The molar content ratio of the cyclic structure in the resin having a cyclic structure at a portion thereof, can be measured by means of NMR etc.

The content of the resin (including the resin having a cyclic structure at a portion thereof) in the resist pattern thickening material can be suitably determined according to the type, content, etc., of the resin without the cyclic structure, the compound represented by the general formula (1), the surfactant described later and the like.

—Compound Represented by the General Formula (1)—

The compound represented by the general formula (1) is not particularly limited as long as it has an aromatic ring at a portion of the structure and is represented by the following general formula (1), and may be appropriately selected according to the purpose. By having the aromatic ring, high etch resistance can be imparted to the resist pattern thickening material even if the resin does not have a cyclic structure at a portion thereof.

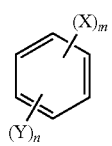

General Formula (1)

In the general formula (1), "X" is a functional group represented by the following structural formula (1). "Y" represents at least any one of a hydroxyl group, an amino group, an amino group substituted by an alkyl group, an alkoxy group, an alkoxycarbonyl group and an alkyl group, and the number of the substitution is an integer of 0 to 3. "m" represents an integer of 1 or more and "n" represents an integer of 0 or more. m is preferably 1 for preventing generation of a crosslinking reaction and for easily controlling the reaction.

Structural Formula (1)

In the structural formula (1), "$R^1$" and "$R^2$" may be the same or different, and each represent a hydrogen atom or a substituent group. "Z" represents at least any one of a hydroxyl group, an amino group, an amino group substituted by an alkyl group, and an alkoxy group, and the number of the substitution is an integer of 0 to 3.

Preferably, in the structural formula (1), $R^1$ and $R^2$ are each a hydrogen atom. When the $R^1$ and $R^2$ are each a hydrogen atom, it often has an advantage in water-solubility.

When the $R^1$ and $R^2$ in the structural formula (1) are the substituent group, the substituent group is not particularly limited and can be appropriately selected according to the purpose. Examples thereof are a ketone (alkylcarbonyl) group, an alkoxycarbonyl group, an alkyl group and the like.

Suitable specific examples of the compound represented by the general formula (1) are a compound having a benzyl alcohol structure, a compound having a benzylamine structure, and the like.

The compound having a benzyl alcohol structure is not particularly limited and can be appropriately selected according to the purpose. Suitable examples are benzyl alcohol and a derivative thereof. Specific examples are benzyl alcohol, 2-hydroxybenzyl alcohol (salicyl alcohol), 2-aminobenzyl alcohol, 4-aminobenzyl alcohol, 2,4-dihydroxybenzyl alcohol, 1,4-benzenedimethanol, 1-phenyl-1,2-ethanedithiol, 4-methoxymethylphenol and the like.

The compound having a benzylamine structure is not particularly limited and can be appropriately selected according to the purpose. Suitable examples are benzylamine and a derivative thereof. Specific examples are benzylamine, 2-methoxybenzylamine, and the like.

These may be used singly, or two or more may be used in combination. Among these, 2-hydroxybenzyl alcohol, 4-aminobenzyl alcohol, and the like are preferred from the point that these have high water solubility, and thus can be dissolved in large amount.

The content of the compound represented by the general formula (1) in the resist pattern thickening material is not particularly limited and can be appropriately selected according to the purpose. For instance, the preferable amount is 0.01 to 50 parts by mass on the total amount of the resist pattern thickening material, and the more preferable amount is 0.1 to 10 parts by mass.

When the content of the compound represented by the general formula (1) is less than 0.01 parts by mass, desired reaction amount may not be obtained. The content exceeding 50 parts by mass is not preferable because it is highly possible that the compound separate out during applying and a defect is caused on the pattern.

—Surfactant—

When there are needs, for example, a need to improve the conformability between a resist pattern thickening material and resist pattern, a need for a larger amount of thickening of the resist pattern to be thickened, a need to improve uniformity of the thickening effect at the interface between a resist pattern thickening material and resist pattern, and a need for anti-forming property, the addition of the surfactant can realize these needs.

The surfactant is not particularly limited and may be appropriately selected according to the purpose. Examples thereof include nonionic surfactants, cationic surfactants, anionic surfactants, amphoteric surfactants and the like. These may be used singly or two or more thereof may be used in combination. Among these, the nonionic surfactants are preferred from the point that they do not contain metallic ions such as sodium ion, potassium ion.

Suitable examples of the nonionic surfactants are ones selected from alkoxylate surfactants, fatty acid ester surfactants, amide surfactants, alcohol surfactants, and ethylenediamine surfactants. Specific examples thereof include polyoxyethylene-polyoxypropylene condensation compounds, polyoxy alkylene alkylether compounds, polyoxy ethylene alkylether compounds, polyoxy ethylene derivative compounds, sorbitan fatty acid ester compounds, glycerine fatty acid ester compounds, primary alcohol ethoxylate compounds, phenol ethoxylate compounds, nonyl phenol ethoxylate compounds, octyl phenol ethoxylate compounds, lauryl alcohol ethoxylate compounds, oleyl alcohol ethoxylate compounds, fatty acid ester, amide, natural alcohol, ethylenediamine, secondary alcohol ethoxylate and the like.

The cationic surfactants are not particularly limited and can be appropriately selected according to the purpose. Examples thereof include alkyl cationic surfactants, amide quaternary cationic surfactants, ester quaternary cationic surfactants, and the like.

The amphoteric surfactants are not particularly limited and can be appropriately selected according to the purpose. Examples thereof include amine oxide surfactants, betaine surfactants, and the like.

The content of the surfactant in the resist pattern thickening material is not particularly limited and can be appropriately selected according to the types, contents, etc., of the resin, compound represented by the general formula (1), phase transfer catalyst, etc. Suitable range of the content of the surfactant is, for example, 0.01 parts by mass or more against 100 parts by mass of the resist pattern thickening material, and preferably 0.05 parts by mass to 2 parts by mass, further preferably 0.08 parts by mass to 0.5 parts by mass.

When the content of the surfactant is 0.01 parts by mass or less, there is an effect on improvement of applying property, however, in most cases, the reaction amount of the resist pattern thickening material hardly differ compared with the case where no surfactant is added.

—Phase Transfer Catalyst—

The phase transfer catalyst is not particularly limited and may be appropriately selected according to the purpose. Examples thereof are organic materials. Among these, suitable examples are basic materials.

When the resist pattern thickening material comprises the phase transfer catalyst, it is advantageous that the resist pattern to be thickened is efficiently and uniformly thickened regardless of a material thereof and the thickening effect shows less dependency on a material of the resist pattern to be thickened. Such effects of the phase transfer catalyst are not impaired, for example, even if the resist pattern, which is the subject to be thickened with use of the resist pattern thickening material, contains an acid generating agent or not.

The phase transfer catalyst is preferably water-soluble, and exhibits a water-solubility of 0.1 g in 100 g of water at a water-temperature of 25° C.

Specific examples of the phase transfer catalyst are crown ethers, azacrown ethers, onium salts, and the like.

The phase transfer catalyst may be used singly or two or more thereof may be used in combination. Among these, the onium salt is preferably from the standpoint of solubility to water.

Examples of the crown ether and azacrown ether are 18-crown-6,15-crown-5,1-aza-18-crown-6,13-diaza-18-crown-6,1,4,7-triazacyclononane, and the like.

The onium salts are not particularly limited and may be appropriately selected according to the purpose, but suitably examples thereof are quaternary ammonium salts, pyridinium salt, thiazolium salts, phosphonium salts, piperazinium salts, ephedrinium salts, quininium salts, and cinchoninium salts, and the like.

Examples of the quaternary ammonium salt are those used as a organic synthesis reagent, namely, tetrabutylammonium hydrogensulfate, tetramethylammonium acetate, tetramethylammonium chloride, and the like.

Examples of the pyridinium salt are hexadecylpyridinium bromide, and the like.

Examples of the thiazolium salt are 3-benxyl-5-(2-hydroxyethyl)-4-methylthiazolium chloride, and the like.

Examples of the phosphonium salt are tetrabutylphosphonium chloride, and the like.

Examples of the piperazinium salt are 1,1-dimethyl-4-phenylpiperazinium iodide, and the like.

Examples of the ephdrinium salt are ((–)-N,N-dimethylephedrinium bromide), and the like.

Examples of the quininium salt are N-benzylquininium chloride, and the like.

Examples of the cinchoninium salt are N-benxylcinchoninium chloride, and the like.

The content of the phase transfer catalyst in the resist pattern thickening material depends on the types and contents etc. of the resin etc., so that it is impossible to define definitely, but it can be suitably selected according to the type and content etc. For example, 10,000 ppm or less is preferable, 10 to 10,000 ppm is more preferable, 10 to 5,000 ppm is further preferable, and 10 to 3,000 ppm is particularly preferable.

When the content of the phase transfer catalyst is 10,000 ppm or less, the advantageous point is that the resist pattern, such as a line-space pattern etc. can be thickened regardless of the size.

The content of the phase transfer catalyst can be measured with use of, for example, liquid chromatography.

—Water-Soluble Aromatic Compound—

The water-soluble aromatic compound is not particularly limited, as long as it is an aromatic compound that has water-solubility, and it can be suitably selected according to the purpose. The compound having water-solubility such that 1 g or more is dissolved into 100 g of water at 25° C. is preferable, and the compound having water-solubility such that 3 g or more is dissolved into 100 g of water at 25° C. is more preferable. Particularly, the most preferable is the compound having water-solubility such that 5 g or more is dissolved into 100 g of water at 25° C.

When the resist pattern thickening material comprises the water-soluble aromatic compound, the preferable point is that the etch resistance of the obtained resist pattern can be remarkably improved because of the cyclic structure contained in the water-soluble aromatic compound.

Examples of the water-soluble aromatic compound are polyphenol compounds, aromatic carboxylic acid compounds, naphthalene polyhydroxy compounds, benzophenone compounds, flavonoid compounds, porphin, water-soluble phenoxy resins, aromatic-containing water-soluble dyes, derivatives thereof, glycosides thereof, and the like. These may be used alone, or two or more may be used in combination.

Examples of the polyphenol compounds include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, resorcine, resorcine[4]arene, pyrogallol, and gallic acid, and the like.

Examples of the aromatic carboxylic acid compounds include salicylic acid, phthalic acid, dihydroxy benzoic acid, tannin, and the like.

Examples of the benzophenone compounds include alizarin yellow A, and the like.

Examples of the flavonoid compounds include flavone, isoflavone, flavanol, flavonone, flavonol, flavan-3-ol, aurone, chalcone, dihydrochalcone, quercetin, and the like.

These may be used singly, or two or more may be used in combination. Among these, the polyphenol compounds are preferable, catechin, resorcine, and the like are particularly preferable.

Among the water-soluble aromatic compound, from the viewpoint of excellent water-solubility, the compound having two or more polar groups is preferable, the compound having three or more is more preferable, and the compound having four or more is particularly preferable.

The polar group is not particularly limited and can be appropriately selected according to the purpose. Examples thereof are a hydroxyl group, a carboxyl group, a carbonyl group, a sulfonyl group, and the like.

The content of the water-soluble aromatic compound in the resist pattern thickening material can be suitably decided according to the types, contents etc. of the resin, compound represented by the general formula (1), phase transfer catalyst, and surfactant etc.

—Organic Solvent—

The organic solvent is not particularly limited and may be suitably selected according to the purpose. Examples thereof include alcohols, linear esters, cyclic esters, ketones, linear ethers, cyclic ethers, and the like.

When the resist pattern thickening material comprises the organic solvent, the advantage is that the resin, the compound represented by the general formula (1), etc. may be improved in terms of the solubility in the resist pattern thickening material.

The organic solvent can be mixed with water for use. Suitable examples of the water are pure water (deionized water), and the like.

Examples of the alcohols are methanol, ethanol, n-propyl alcohol, isopropyl alcohol, butyl alcohol, and the like.

Examples of the linear esters include ethyl lactate, propylene glycol methyl ether acetate (PGMEA), and the like.

Examples of the cyclic esters include lactones such as γ-butyrolactone, and the like.

Examples of the ketones include acetone, cyclohexanone, and heptanone, and the like.

Examples of the linear ethers include ethyleneglycol dimethylether, and the like.

Examples of the cyclic ethers include tetrahydrofuran, dioxane, and the like.

These organic solvents may be used alone, or two or more may be used in combination. Among these, solvents having a boiling point of about 80 to 200° C. are preferable from the viewpoint of performance to thicken the resist pattern precisely.

The content of the organic solvent in the resist pattern thickening material can be suitably decided according to the type, content etc. of the resin, compound represented by the general formula (1), phase transfer catalyst, and surfactant etc.

—Other Components—

The other components are not particularly limited as long as they do not interfere with the effects of the present invention, and may be suitably selected according to the purpose. Examples are various types of known additives such as thermal acid generating agents, quenchers such as amine type, amide type, and the like.

The content of the other components in the resist pattern thickening material can be decided according to the kind, content etc. of the resin, compound represented by the general formula (1), phase transfer catalyst, and surfactant etc.

—Use and the Like—

The resist pattern thickening material of the present invention can be used by applying over the resist pattern to be thickened.

In the applying, the surfactant may be applied separately before applying the resist pattern thickening material without adding the surfactant into the resist pattern thickening material.

When the resist pattern thickening material is applied over the resist pattern to be thickened and is made to interact or mix with the resist pattern to be thickened, the resist pattern thickening material and the resist pattern undergo interaction to form a mixing layer. As a result, the resist pattern to be thickened is thickened by an amount corresponding to the mixing layer, and a thickened resist pattern is formed.

At this time, the resist pattern thickening material comprises the compound represented by the general formula (1), thus the resist pattern is efficiently and uniformly thickened regardless of a material or size of the resist pattern. With utilization of such resist pattern thickening material, therefore, the thickening effect of the resist pattern is hardly affected by the material or size of the resist pattern.

The resist pattern, which is formed in this way, represents space patterns of which the diameter or width is smaller than the space patterns of resist pattern prior to thickening. As a result, the space pattern formed by the resist pattern exceeds exposure limits or resolution limits of light sources and can represent finer structures, in other words, the size of spaces such as pore and ternch of the resulting space pattern is smaller than the lower limit of space that can be patterned by the wavelength of light used for the light sources. Accordingly, when patterning a resist pattern by means of ArF excimer laser beam, and thickening the resist pattern by means of the resist pattern thickening material, the space pattern of resist formed by the thickened resist pattern can represent such fine and precise conditions as those patterned by electron beam.

Note that, the amount of thickening of the resist pattern to be thickened can be controlled to a desired degree by appropriately adjusting the viscosity of the resist pattern thickening material, the coating thickness of the resist pattern thickening material, the baking temperature, the baking time, and the like.

—Material of Resist Pattern to be Thickened—

The material of the resist pattern to be thickened (the resist pattern on which the resist pattern thickening material of the present invention is applied) is not particularly limited, and can be appropriately selected from among known resist materials according to the purpose. The material of the resist pattern to be thickened may be a negative type or a positive type. Suitable examples include g-line resists, i-line resists, KrF resists, ArF resists, $F_2$ resists, electron beam resists, and the like, which can be patterned by g-line, i-line, KrF excimer laser light, ArF excimer laser light, $F_2$ excimer laser light, electron beam, and the like, respectively. These resists may be chemically amplified types, or non-chemically amplified types. Among these, KrF resists, ArF resists, and resists containing acrylic resins are preferable; in addition, at least one of ArF resists and resists containing acrylic resin is preferable from the view point that they are demanded in terms of improvement in resolution limit for finer patterning and increase of throughput.

The specific examples of the resist pattern material include novolak resists, PHS resists, acrylic resists, cycloolefin-maleic acid anhydrate (COMA) resists, cycloolefin resists, hybrid resists such as alicyclic acrylic-COMA copolymer and the like. These resists may be modified by fluorine.

The process for forming the resist pattern to be thickened, and the size, the thickness and the like of the resist pattern to be thickened are not particularly limited, and can be appropriately selected according to the purpose. In particular, the thickness can be appropriately determined by the surface of the workpiece to be worked and etching conditions and is generally from about 0.1 μm to about 500 μm.

The thickening of the resist pattern to be thickened by using the resist pattern thickening material of the present invention will be described hereinafter with reference to the drawings.

Figure 2:
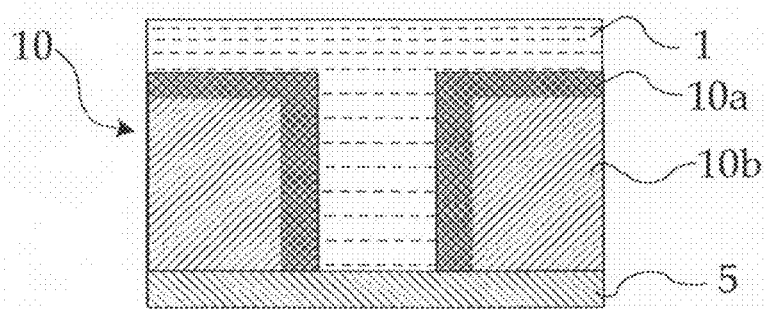
FIG. 2 is a schematic diagram for explaining one example of the mechanism of thickening a resist pattern to be thickened by using a resist pattern thickening material of the present invention, and showing the state where the resist pattern thickening material infiltrates into the surface of the resist pattern to be thickened.

As shown in FIG. 1, after a resist pattern to be thickened 3 has been formed on a work surface (base material) 5, a resist pattern thickening material 1 is applied over the surface of the resist pattern to be thickened 3. Prebaking (heating and drying) is carried out, such that a coated film is formed. Then, mixing or infiltrating of the resist pattern thickening material 1 into the resist pattern to be thickened 3 occurs at the interface between the resist pattern to be thickened 3 and the resist pattern thickening material 1. As shown in FIG. 2, a surface layer or mixing layer 10a is formed as the result of reaction of the mixed or infiltrated portions at the interface of an inner layer resist pattern 10b (the resist pattern to be thickened 3) and the resist pattern thickening material 1. At this time, the resist pattern thickening material 1 comprises the compound represented by the general formula (1), and thus the inner layer resist pattern 10b (the resist pattern to be thickened 3) is efficiently and uniformly thickened without being affected by the size of the inner layer resist pattern 10b (the resist pattern to be thickened 3).

Figure 3:
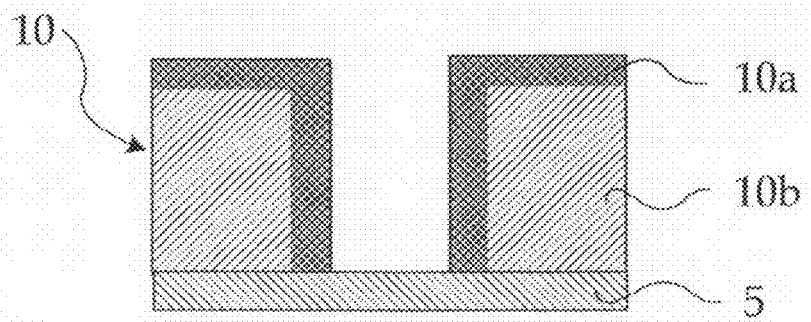
FIG. 3 is a schematic diagram for explaining one example of the mechanism of thickening a resist pattern to be thickened by using a resist pattern thickening material of the present invention, and showing the state where the resist pattern to be thickened is thickened by the resist pattern thickening material, thereby forming a resist pattern.

Thereafter, as shown in FIG. 3, by carrying out developing processing, the portions with no interaction or mixing with the resist pattern 3 or portions with less interaction or mixing with the resist pattern 3, i.e., the portions having high water-solubility, in the resist pattern thickening material 1 applied on the resist pattern 3, are dissolved and removed, and a thickened resist pattern 10 which is uniformly thickened, is developed or formed.

The developing processing may be water developing or may be developing by an alkaline developing solution, but water containing a surfactant and an alkaline developing solution containing a surfactant can be also appropriately used according to necessity, which will be described in more detail later.

The thickened resist pattern 10 has, on the surface of the inner layer resist pattern 10b (the resist pattern to be thickened 3), the surface layer 10a which has been formed as a result of mixing or infiltrating of the resist pattern thickening material 1. Since the thickened resist pattern 10 is thicker than the resist pattern to be thickened 3 by an amount corresponding to the thickness of the surface layer 10a, the size of space pattern formed by the thickened resist pattern, i.e., the distance between adjacent thickened resist patterns 10 or opening diameter of the hole pattern formed by the thickened resist pattern 10, is smaller than that formed by the resist pattern to be thickened 3 prior to thickening. Thus, the space pattern formed by the resist pattern exceeds exposure limits or resolution limits of light sources of the exposure device upon forming the resist pattern to be thickened 3. Accordingly, when patterning a resist pattern by means of ArF excimer laser light, and thickening the resist pattern by means of the resist pattern thickening material, the space pattern of resist formed by the thickened resist pattern can represent such fine conditions as those patterned by electron beam. The space pattern formed by the thickened resist pattern 10 is finer and more precise than the space pattern formed by the resist pattern 3.

The surface layer 10a of the thickened resist pattern 10 is formed by the resist pattern thickening material 1. The compound represented by the general formula (1) in the resist pattern thickening material 1 has an aromatic ring, and thus even if the resist pattern to be thickened 3 is a material having low etch resistance, the resulting thickened resist pattern 10 has high etch resistance. When the resist pattern thickening material 1 comprises a resin having a cyclic structure at a portion thereof or the like, thereby comprising the cyclic structure in the resist pattern thickening material 1, etch resistance is further improved.

The resist pattern thickening material of the present invention can be suitably used in thickening a resist pattern to be thickened, and making the space pattern fine, exceeding exposure limits. The resist pattern thickening material of the present invention is particularly suitably used in the process for forming a resist pattern of the present invention, the process for manufacturing a semiconductor device of the present invention, and the like.

Further, since the compound represented by the general formula (1) in the resist pattern thickening material of the present invention has an aromatic ring, the resist pattern thickening material of the present invention can be suitably used for coating or thickening a resist pattern formed of resin or the like which is exposed to plasma, etc., and thus is required to make the etch resistance of the surface improved. In addition, when the resist pattern thickening material of the present invention comprises the resin having a cyclic structure at a portion thereof or the like, thereby comprising the cyclic structure in the resist pattern thickening material, the resist pattern thickening material of the present invention can be more suitably used for coating or thickening the resist pattern.

Even in cases such as a case where the resist pattern thickening material is alkalified to pH 10 or more by adding an alkaline substance into the resist pattern thickening material of the present invention and the resist pattern thickening material or a case where the resist pattern thickening material is used against the resist pattern which had been left under uncontrolled atmosphere outside a clean room for one year after exposure, the use of the resist pattern thickening material of the present invention enables a resist pattern to be thickened to the same degree as is thickened without such operation. Furthermore, even in the case where a non-chemically amplified type resist which dose not contain an acid, an acid generating agent, or the like is patterned by electron beam exposure to form a resist pattern to be thickened, the resist pattern thickening material of the present invention can be applied over the resist pattern to be thickened and is capable of thickening the resist pattern in the same way as in the chemically amplified type resist. From these facts, it can be easily understood that the reaction proceeds in a different form from RELACS material which utilizes an acid.

(Process for Forming Resist Pattern)

The process for forming a resist pattern of the present invention comprises forming a resist pattern to be thickened, and then applying the resist pattern thickening material of the present invention so as to cover the surface of the resist pattern to be thickened, preferably comprises irradiating the entire surface of the resist pattern to be thickened with one of ultraviolet light and ionizing radiation before the application, and may further comprise other treatments suitably selected according to necessity.

Suitable examples of materials of the resist pattern to be thickened are the above-mentioned materials in the description of the resist pattern thickening material of the present invention.

The resist pattern to be thickened can be formed in accordance with known methods.

The resist pattern to be thickened can be formed on a surface of a workpiece (base material). The surface of the workpiece (base material) is not particularly limited, and can be appropriately selected according to the purpose. However, when the resist pattern to be thickened is formed into a semiconductor device, the surface of the workpiece (base material) is, for example, a surface of a semiconductor substrate. Specific suitable examples thereof include the surfaces of the substrate such as a silicon wafer, various types of oxide films, or the like.

The method of applying the resist pattern thickening material is not particularly limited, and can be appropriately selected from among known coating methods according to the purpose. Suitable examples are a spin coating method and the like. In the case where a spin coating method is used, the conditions are as follows for example: the rotational speed is about 100 rpm to 10,000 rpm, and is preferably 800 rpm to 5,000 rpm, and the time is about one second to 10 minutes, and is preferably 1 second to 90 seconds.

The coated thickness at the time of coating is usually about 10 to 1,000 nm (100 to 10,000 angstroms) and 100 to 500 nm (1,000 to 5,000 angstroms) is preferable.

Note that, at the time of coating, the surfactant may be applied before and separately from applying the resist pattern thickening material, without being contained in the resist pattern thickening material.

It is also preferable that the entire surface of the resist pattern to be thickened be irradiated with one of ultraviolet light or ionizing radiation before applying the resist pattern thickening material (hereinafter sometimes referring to as "pre-treatment exposure") in terms of adjusting the surface condition of the resist film on a wafer. In this case, when the resist pattern thickening material is applied after irradiation, the difference in the amount of thickening due to the difference in density of pattern can be reduced, and resist pattern with an intended size can be obtained stably and efficiently. Specifically, in the case where resist patterns with different pitch of the patterns, which have sparse regions of the resist pattern (regions where the pitch of resist pattern is long) and dense regions of the resist pattern (regions where the pitch of resist pattern is short), or resist patterns, in which various sizes are mixed, are thickened, there was a problem that the amounts of thickening differed depending on the density and size. This arises from the fact that the light intensity distribution during exposure differs depending on pattern, and slight degree of difference of surface condition to such a degree that remains unrecognized in the development of the resist pattern (difference of fogging exposure dose) influences the easiness of forming a mixing layer which is formed as a result of interaction between the resist pattern and the resist pattern thickening material. When the entire surface of the resist pattern to be thickened is irradiated with one of ultraviolet light or ionizing radiation before applying the resist pattern thickening material, the conditions of the surface of the resist film can be adjusted, allowing the amount of thickening the resist pattern to be uniform.

The source of ultraviolet light or ionizing radiation for the pre-treatment exposure are not particularly limited and can be appropriately selected according to the sensitive wavelength of the material of the resist pattern. Specific examples of the ultraviolet light and ionizing radiation include broadband ultraviolet light emitted from a high-pressure mercury lamp or low-pressure mercury lamp, as well as g-line (wavelength: 436 nm), i-line (wavelength: 365 nm), KrF excimer laser light (wavelength: 248 nm), ArF excimer laser light (wavelength: 193 nm), $F_2$ excimer laser light (wavelength: 157 nm), EUV light (soft x-ray region having a wavelength of 5 nm to 15 nm), or electron beam, X-ray etc. In terms of the structure of manufacturing equipment, it is preferable to select from these the same ultraviolet light or ionizing radiation as that used during exposure in forming the resist pattern.

The irradiation dose (exposure dose), at which the resist pattern to be thickened is irradiated with the ultraviolet light or ionizing radiation, is not particularly limited, can be appropriately selected according to the type of the ultraviolet light or ionizing radiation to be used, but, for example, is preferably 0.1% to 20% relative to the irradiation dose (exposure dose) required for forming the resist pattern.

When the irradiation dose is less than 0.1%, the surface of the resist film may not be adjusted in a uniform state effectively. When the irradiation dose exceeds 20%, photoreaction in the resist pattern occurs more than required, the upper part of the resist pattern turns to be solubilized in an alkaline developer to give the pattern deformation or partial loss.

As long as the entire surface of the resist pattern to be thickened is irradiated with the ultraviolet light or ionizing radiation at a specific irradiation dose, the method is not particularly limited. Irradiation can be carried out by appropriately adjusting, irradiation time, irradiation dose, etc. as follows. When a strong light is used, irradiation can be carried out for a short time, and when a weak light is used, for a long time. When a resist material with a high exposure sensitivity is used, irradiation can be carried out with less exposure dose (irradiation dose), and when a resist material with a low exposure sensitivity is used, with more exposure dose (irradiation dose).

Further, by carrying out prebaking (heating and drying) of the applied resist pattern thickening material during applying or after applying, the resist pattern thickening material can be efficiently mixed or infiltrated into the resist pattern to be thickened at the interface between the resist pattern to be thickened and the resist pattern thickening material.

The conditions, the method and the like of the prebaking (heating and drying) are not particularly limited as long as they do not cause softening of the resist pattern to be thickened, and can be appropriately selected according to the purpose. For example, the prebaking may be carried out once, or two or more times. When the prebaking is carried out two or more times, the temperature of prebaking at each time may be constant or may be different. When the temperature is constant, the temperature is preferably about 40° C. to 150° C., and 70° C. to 120° C. is more preferable, and the time is preferably about 10 seconds to 5 minutes, and 40 seconds to 100 seconds is more preferable.

Moreover, according to necessity, carrying out baking of the applied resist pattern thickening material after the prebaking (heating and drying) is preferable from the standpoint that the mixing or infiltrating at the interface of the resist pattern to be thickened and the resist pattern thickening material can be made to proceed efficiently.

The conditions, the method and the like of the baking are not particularly limited and can be appropriately selected according to the purpose. However, usually, a higher temperature than that at the prebaking (heating and drying) is used. The conditions of the baking are, for example, that the temperature is about 70° C. to 150° C., and 90° C. to 130° C. is preferable, and the time is about 10 seconds to 5 minutes, and 40 seconds to 100 seconds is preferable.

Moreover, carrying out developing processing of the applied resist pattern thickening material after the baking is preferable. In this case, carrying out developing processing is preferable in that, the portions with no interaction or mixing with the resist pattern, or the portions with less interaction or mixing with the resist pattern, i.e., the portions having high water-solubility, in the applied resist pattern thickening material, are dissolved and removed, and a thickened resist pattern is developed or obtained.

The developing processing is not particularly limited and can be appropriately selected according to the purpose. It may be water developing or may be alkaline developing, and the developing processing is also preferably carried out using water containing a surfactant or an alkaline developing solution containing a surfactant. In this case, uniformity of the thickening effect at the interface between the resist pattern thickening material and resist pattern is improved, allowing the generation of residue or defects to be reduced.

The surfactant is not particularly limited and can be appropriately selected according to the purpose. For example, a non-ionic surfactant is suitable in that it does not contain metallic ions such as sodium salt and potassium salt.

The non-ionic surfactant is not particularly limited and can be appropriately selected according to the purpose. Suitable specific examples include polyoxyethylene-polyoxypropylene condensation compounds, polyoxyalkylene alkyl ether compounds, polyoxyethylene alkyl ether compounds, polyoxyethylene derivative compounds, silicone compounds, sorbitan fatty acid ester compounds, glycerine fatty acid ester compounds, alcohol ethoxylate compounds, phenol ethoxylate compounds, and the like. These may be used singly, or two or more thereof may be used in combination. Even an ionic surfactant can be used if it is a non-metallic salt.

The content of the surfactant in water (fundamental solution for developing) is not particularly limited, can be appropriately selected according to the purpose, but is preferably 0.001% by mass to 1% by mass, more preferably 0.05% by mass to 0.5% by mass. If the content is less than 0.001% by mass, the effect of the surfactant is small, and if it exceeds 1% by mass, space may widen due to excess dissolving power of developing solution, influence on the dimension and reduced amount of space size of resist becomes significant, for example, pattern-edge becomes round, and besides, residue and defect due to the generation of bubble may be generated easily.

The alkaline developing solution is not particularly limited and can be appropriately selected from known ones used in manufacturing a semiconductor device. Suitable examples thereof include an aqueous solution of quaternary ammonium hydroxide solution, an aqueous solution of choline, and the like. These may be used singly, or two or more thereof may be used in combination. Among these, an aqueous solution of tetramethylammonium hydroxide is preferable because it can be used at low cost and is highly versatile.

Further, the surfactant may be added to the alkaline developing solution according to necessity. In this case, the content of the surfactant in the alkaline developing solution is not particularly limited, can be appropriately selected according to the purpose, but, is the same as mentioned above, preferably 0.001% by mass to 1% by mass, more preferably 0.05% by mass to 0.5% by mass.

The process for forming a resist pattern of the present invention will be described hereinafter with reference to the drawings.

Figure 4:
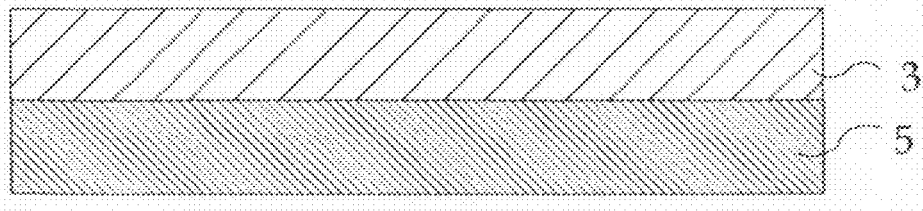
FIG. 4 is a schematic diagram for explaining an example of a process for forming a resist pattern of the present invention, and showing the state where a resist film is formed.
Figure 5A:
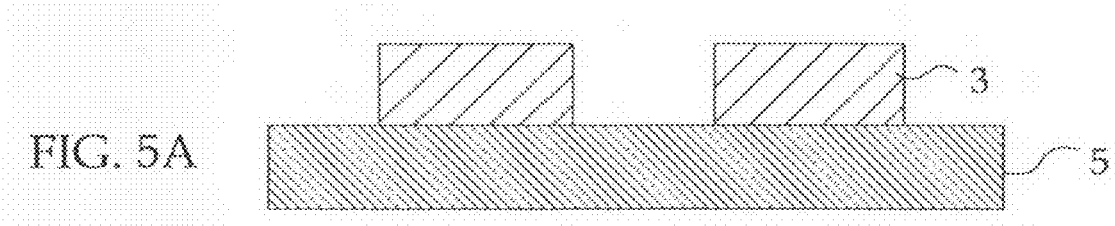
FIG. 5A is a schematic diagram for explaining an example of a process for forming a resist pattern of the present invention, and showing the state where the resist film is subjected to a patterning, thereby forming a resist pattern to be thickened.
Figure 5B:
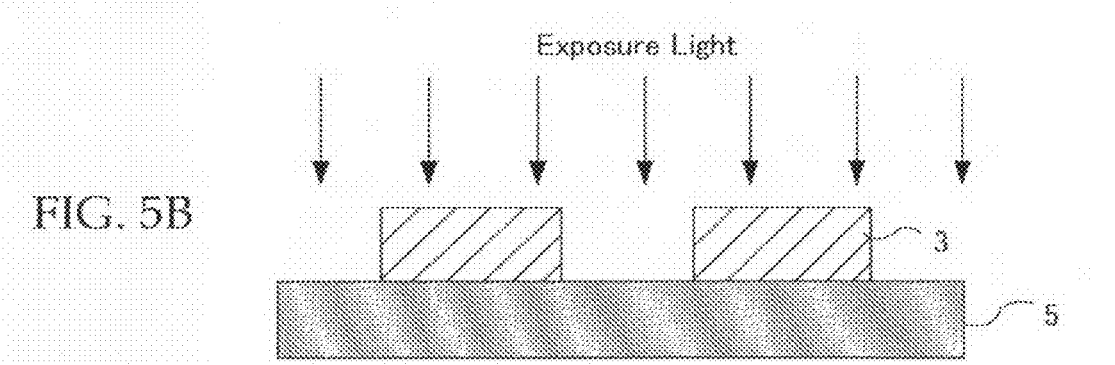
FIG. 5B is a schematic diagram for explaining an example of a process for forming a resist pattern of the present invention, and showing the state where the entire surface of a resist pattern to be thickened is irradiated with exposure light.
Figure 6:
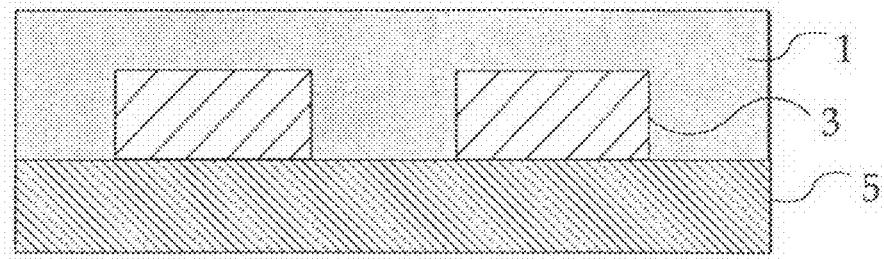
FIG. 6 is a schematic diagram for explaining an example of a process for forming a resist pattern of the present invention, and showing the state where the resist pattern thickening material is applied over the surface of the resist pattern to be thickened.
Figure 7:
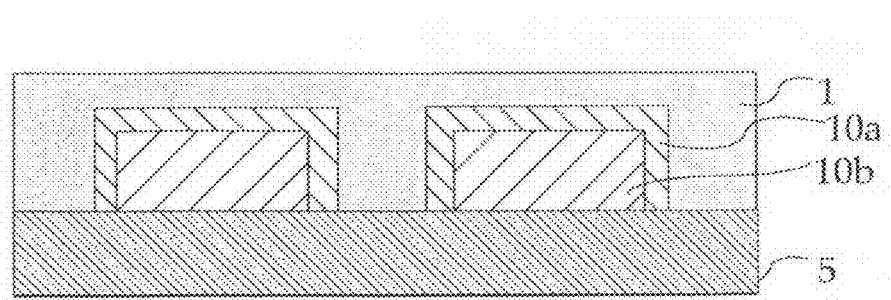
FIG. 7 is a schematic diagram for explaining an example of a process for forming a resist pattern of the present invention, and showing the state where a mixing is occurred at the vicinity of the surface of the resist pattern to be thickened and the resist pattern thickening material infiltrates into the resist pattern to be thickened.
Figure 8:
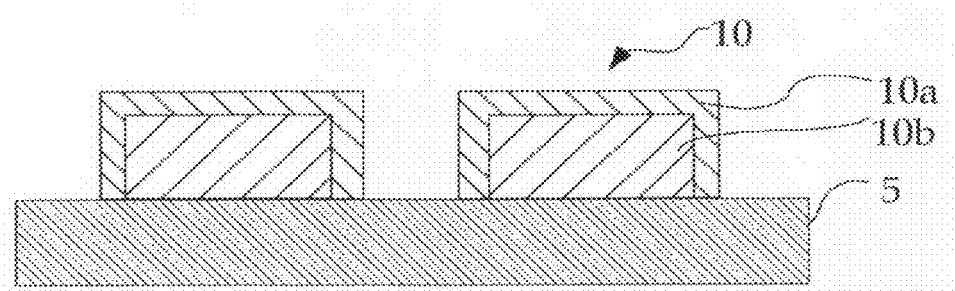
FIG. 8 is a schematic diagram for explaining an example of a process for forming a resist pattern of the present invention, and showing the state where the resist pattern thickening material is developed.

As shown in FIG. 4, a resist material 3a is applied on the work surface (base material) 5. Then, as shown in FIG. 5A, the resist material 3a is patterned to form the resist pattern to be thickened 3. Thereafter, as shown in FIG. 5B, it is preferable to irradiate the entire surface of the obtained resist pattern to be thickened 3 with exposure light. Next, as shown in FIG. 6, the resist pattern thickening material 1 is applied over the surface of the resist pattern to be thickened 3, and prebaking (heating and drying) is carried out to form a coated film. Then, mixing or infiltrating of the resist pattern thickening material 1 into the resist pattern to be thickened 3 takes place at the interface of the resist pattern to be thickened 3 and the resist pattern thickening material 1. As shown in FIG. 7, portions with mixing or infiltrating at the interface between the resist pattern to be thickened 3 and the resist pattern thickening material 1 further interact or react. Thereafter, as shown in FIG. 8, by carrying out developing processing, the portions with no reaction or less interaction or mixing with the resist pattern to be thickened 3, i.e., the portions having high water-solubility, in the applied resist pattern thickening material 1, are dissolved and removed, such that the thickened resist pattern 10 composed of the inner layer resist pattern 10b (the resist pattern to be thickened 3) and surface layer 10a thereon, is developed or formed.

The developing processing may be water developing or may be developing by an alkaline solution, and is also preferably performed using the water containing a surfactant or the alkaline developing solution containing a surfactant.

The thickened resist pattern 10 is formed as a result of thickening of the resist pattern to be thickened 3 by the resist pattern thickening material 1, and has, on the surface of the inner layer resist pattern 10b (the resist pattern to be thickened 3), the surface layer 10a formed as a result of reaction of resist pattern thickening material 1. Upon thickening, since the resist pattern thickening material 1 comprises the compound represented by the general formula (1), the inner layer resist pattern 10b (the resist pattern to be thickened 3) is uniformly thickened to form the thickened resist pattern 10 without being adversely affected by the type of the material, the size and the like of the resist pattern to be thickened 3. The thickened resist pattern 10 is thicker than the resist pattern to be thickened 3 (the inner layer resist pattern 10b) by an amount corresponding to the thickness of the surface layer 10a. Thus, the width of the space pattern formed by the thickened resist pattern 10 is smaller than that of the space pattern formed by the resist pattern to be thickened 3, and the space pattern formed by the thickened resist pattern 10 is fine.

The surface layer 10a of the resist pattern 10 is formed by the resist pattern thickening material 1 and the compound represented by the general formula (1) in the resist pattern thickening material 1 has an aromatic ring. Therefore, even if the resist pattern to be thickened 3 (the inner layer resist pattern 10b) is a material having a low etch resistance, the resist pattern 10, which has, on the surface thereof, the surface layer or mixing layer 10a having high etch resistance, can be formed. In addition, when the resist pattern thickening material 1 comprises a resin having a cyclic structure at a portion thereof or the like, thereby comprising the cyclic structure in the resist pattern thickening material 1, the etch resistance of the surface layer or mixing layer 10a is further improved.

The resist pattern which is formed by the process for forming a resist pattern of the present invention (hereinafter sometimes referring to as "thickened resist pattern") has, on the surface of the resist pattern to be thickened, the surface layer which is formed by interacting or mixing of resist pattern thickening material. The resist pattern thickening material comprises the compound represented by the general formula (1) having an aromatic ring, and thus, even if the resist pattern to be thickened is a material which has low etch resistance, the thickened resist pattern, which has, on the surface of the resist pattern to be thickened, the surface layer or mixing layer having high etch resistance, can be efficiently formed. When the resist pattern thickening material comprises the cyclic structure, e.g., comprising a resin having a cyclic structure at a portion thereof or the like, the etch resistance of the surface layer or mixing layer is further improved. Further, the thickened resist pattern formed by the process for forming a resist pattern of the present invention is thicker than the resist pattern to be thickened by an amount corresponding to the thickness of the surface layer or mixing layer. Therefore, the size such as diameter and width of the space pattern formed by thickened resist pattern 10 is smaller than that of a space pattern formed by the resist pattern to be thickened. Therefore, by using the process for forming a resist pattern of the present invention, a fine space pattern of resist can be formed efficiently.

The thickened resist pattern preferably has high etch resistance. It is preferable that the etching rate (nm/min) of the thickened resist pattern is equivalent to or less than that of the resist pattern to be thickened. Specifically, the ratio of the etching rate (nm/min) of the resist pattern to be thickened to the etching rate (nm/min) of the surface layer or mixing layer determined under the same condition, i.e., resist pattern to be thickened/surface layer or mixing layer, determined under the same condition is preferably 1.1 or more, more preferably 1.2 or more, and particularly preferably 1.3 or more.

The etching rate (nm/min) can be determined, for example, by measuring a reduction of a sample film using a conventional etching system after etching for a predetermined time, and calculating a reduction per unit time.

The surface layer or mixing layer can be suitably formed by using the resist pattern thickening material of the present invention. From the standpoint of further improving the etch resistance, the resist pattern thickening material comprises the cyclic structure, e.g., comprising a resin having a cyclic structure at a portion thereof or the like.

Whether or not the surface layer or mixing layer contains the cyclic structure, can be confirmed by, for example, analyzing the IR absorption spectrum of the surface layer or mixing layer.

The process for forming a resist pattern of the present invention is suitable for forming a variety of space pattern of resist, for example, a line-space pattern, hole pattern (e.g., for contact hole), trench (groove) pattern, etc. The thickened resist pattern formed by the process for forming a resist pattern can be used as a mask pattern, reticle pattern and the like, can be applied for manufacturing functional parts such as metal plugs, various wirings, recording heads, LCDs (liquid crystal displays), PDPs (plasma display panels), SAW filters (surface acoustic wave filters); optical parts used in connecting optical wiring; fine parts such as microactuators; semiconductor devices; and the like, and can be suitably employed in the process for manufacturing a semiconductor device of the present invention which will be described hereinafter.

(Process for Manufacturing Semiconductor Device)

The process for manufacturing a semiconductor device of the present invention comprises a resist pattern forming step and a patterning step, and may further comprise any other steps suitably selected according to necessity.

The resist pattern forming step is a step for forming a thickened resist pattern on a surface of a workpiece using the process for forming a resist pattern of the present invention, and is a step for thickening a resist pattern to be thickened by forming a resist pattern to be thickened on a surface of a workpiece, and then by applying the resist pattern thickening material of the present invention so as to cover the surface of the resist pattern to be thickened. The resist pattern forming step forms a thickened resist pattern on the surface of the workpiece.

Details of the resist pattern forming step are the same as those of the process for forming a resist pattern of the present invention.

Examples of the surface of the workpiece are surface layers of various members in semiconductor devices. Suitable examples are substrates such as silicon wafers, surface layers thereof, various types of oxide films, and the like. The resist pattern to be thickened is as described above. The method of coating is as described above. Further, after the coating, it is preferable to carry out the above-described prebaking, baking, and the like.

The patterning step is a step for patterning the surface of the workpiece by carrying out etching by using the thickened resist pattern formed by the resist pattern forming step as a mask or the like (as a mask pattern or the like).

The method of etching is not particularly limited, and can be appropriately selected from among known methods according to the purpose. Dry etching is a suitable example. The etching conditions are not particularly limited, and can be appropriately selected according to the purpose.

Suitable examples of the other steps are a surfactant coating step, a developing processing step, and the like.

The surfactant coating step is a step for applying the surfactant on the surface of the resist pattern to be thickened before the resist pattern forming step.

The surfactant is not particularly limited, and can be appropriately selected according to the purpose. Suitable examples are the surfactants listed above, and polyoxyethylene-polyoxypropylene condensation product compounds, polyoxyalkylene alkylether compounds, polyoxyethylene alkylether compounds, polyoxyethylene derivative compounds, sorbitan fatty acid ester compounds, glycerin fatty acid ester compounds, primary alcohol ethoxylate compounds, phenol ethoxylate compounds, and nonylphenol ethoxylate, octylphenol ethoxylate, lauryl alcohol ethoxylate, oleyl alcohol ethoxylate, fatty acid ester, amide, natural alcohol, ethylene diamine, secondary alcohol ethoxylate, alkyl cationic, amide quaternary cationic, ester quaternary cationic, amine oxide, and betaine surfactants, and the like.

The developing processing step is a step for carrying out development of the applied resist pattern thickening material after the resist pattern forming step and before the patterning step. Note that the developing processing is as described above.

By using the process for manufacturing a semiconductor device of the present invention, it is possible to efficiently manufacture various types of semiconductor devices such as flash memories, DRAMs, FRAMs.

The present invention will be illustrated in further detail with reference to several examples below, which are not intended to limit the scope of the present invention.

Example 1

Preparation of Resist Pattern Thickening Material

Resist pattern thickening materials A through T having the compositions shown in Table 1 were prepared.

Note that, in Table 1, the "thickening material" means a resist pattern thickening material, and "A" through "T" correspond to the resist pattern thickening materials A through T. Of the resist pattern thickening materials A through T, the resist pattern thickening materials A, B, and P correspond to comparative example and the resist pattern thickening materials C to O and Q to T correspond to examples (of the present invention). Note that, in Table 1, the unit of the values in parentheses is parts by mass.

In the "compound represented by the general formula (1)" column of resist pattern thickening materials C to O and Q to T, benzyl alcohol, benzylamine, and a derivative thereof are compounds represented by the following general formula (1).

General Formula (1)

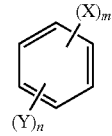

In the general formula (1), "X" is a functional group represented by the following structural formula (1). "Y" represents at least any one of a hydroxyl group, an amino group, an amino group substituted by an alkyl group, an alkoxy group, an alkoxycarbonyl group and an alkyl group, and the number of the substitution is an integer of 0 to 3. "m" represents an integer of 1 or more and "n" represents an integer of 0 or more.

Structural Formula (1)

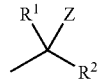

In the structural formula (1), "$R^1$" and "$R^2$" may be the same or different, and each represent a hydrogen atom or a substituent group. "Z" represents at least any one of a hydroxyl group, an amino group, an amino group substituted by an alkyl group, and an alkoxy group, and the number of the substitution is an integer of 0 to 3.

In the "resin" column, "PVA" is a polyvinyl alcohol resin ("PVA-205" manufactured by Kuraray Co., Ltd.) and "KW-3" is a polyvinyl acetal resin (manufactured by Sekisui Chemical Co., Ltd.). In the "surfactant" column, "PC-6" is a non-ionic surfactant (a polynuclear phenol ethoxylate surfactant manufactured by Asahi Denka Co., Ltd.) and "SO-145" is a non-ionic surfactant (a secondary alcohol ethoxylate surfactant manufactured by Asahi Denka Co., Ltd.).

In the resist pattern thickening materials A to K, M, and Q to S, 96 gram of pure water (deionized water) was used as the solvent component. In the resist pattern thickening materials P and T, a mixed solution of pure water (deionized water) and isopropyl alcohol as the organic solvent (whose mass ratio was pure water (deionized water):isopropyl alcohol=98.6 g: 0.4 g) was used as the solvent component. In the resist pattern thickening materials L, N and O, a mixed solution of pure water (deionized water) and isopropyl alcohol (pure water (deionized water):isopropyl alcohol=95.5 g: 0.5 g) was used as the solvent component.

In Table 1, "*1" in the "compound represented by the general formula (1)" column of the resist pattern thickening material P represents that 1.35 parts by mass of tetra(methoxymethyl)glycoluril as the crosslinking agent was added instead of the compound represented by the general formula (1).

—Forming of Resist Pattern—

The resist pattern thickening materials A through T of the present invention which were prepared as described above were applied over hole patterns (each having the opening diameter shown in "initial space size of resist" in Table 2) formed by ArF resists ("AR1244J", manufactured by JSR Corporation), by a spin coating method, first under the condition of 1,000 rpm/5 s, and then under the condition of 3,500 rpm/40 s. Thereafter, baking was carried out under the condition of 110° C./60 s. Then, the resist pattern thickening materials A through T each were rinsed for 60 seconds with pure water and unreacted portions with no interaction or mixing were removed to develop the resist pattern thickened by the resist pattern thickening materials A through T, respectively. Thus, thickened resist patterns were formed.

The sizes (diameters) of the hole patterns formed by the resulting thickened resist patterns are shown in Table 2 together with the initial pattern sizes (the sizes of the hole patterns formed by the resist patterns to be thickened before

TABLE 1

| Thickening material | Resin (Parts by mass) | Compound represented by the general formula (1) (Parts by mass) | Solvent (Parts by mass) | Surfactant (Parts by mass) |
|---|---|---|---|---|
| A | PVA (4) | — | pure water (96) | — |
| B | PVA (4) | — | pure water (96) | SO-145 (0.05) |
| C | PVA (4) | benzyl alcohol (1) | pure water (96) | — |
| D | PVA (4) | 2-hydroxybenzyl alcohol (1) | pure water (96) | — |
| E | PVA (4) | 2-hydroxybenzyl alcohol (2) | pure water (96) | — |
| F | PVA (4) | 4-hydroxybenzyl alcohol (1) | pure water (96) | — |
| G | PVA (4) | 2-hydroxybenzyl alcohol (1) | pure water (96) | PC-6 (0.08) |
| H | PVA (4) | 2-hydroxybenzyl alcohol (1) | pure water (96) | SO-145 (0.05) |
| I | PVA (4) | 2-aminobenzyl alcohol (1) | pure water (96) | — |
| J | PVA (4) | 4-aminobenzyl alcohol (1) | pure water (96) | — |
| K | PVA (4) | 2,4-dihydroxybenzyl alcohol (1) | pure water (96) | PC-6 (0.25) |
| L | PVA (4) | 2-methoxybenzylamine | pure water (95.5) + IPA (0.5) | — |
| M | KW-3 (16) | 2-hydroxybenzyl alcohol (1) | pure water (96) | — |
| N | KW-3 (16) | 2-hydroxybenzyl alcohol (1) | pure water (95.5) + IPA (0.5) | PC-6 (0.08) |
| O | KW-3 (16) | 2-hydroxybenzyl alcohol (1) | pure water (95.5) + IPA (0.5) | SO-145 (0.25) |
| P | KW-3 (16) | —*1 | pure water (98.6) + IPA (0.4) | PC-6 (0.25) |
| Q | PVA (4) | 1,4-benzenedimethanol (1) | pure water (96) | — |
| R | PVA (4) | 1-phenyl-1,2-ethanedithiol (1) | pure water (96) | — |
| S | PVA (4) | 4-methoxymethylphenol (1) | pure water (96) | — |
| T | KW-3 (16) | 2-hydroxybenzyl alcohol (1.35) | pure water (98.6) + IPA (0.4) | PC-6 (0.25) | thickening, i.e., the "space size (hole diameter) of resist before thickening" in Table 2). Note that, in Table 2, "A" through "T" correspond to the resist pattern thickening materials A through T.

TABLE 2

| Thickening material | Space size (hole diameter) of resist before thickening (nm) | Space size (hole diameter) of resist after thickening (nm) |
| --- | --- | --- |
| A | 108.5 | 105.2 |
| B | 112.3 | 114.1 |
| C | 106.8 | 96.6 |
| D | 109.7 | 87.7 |
| E | 106.6 | 78.4 |
| F | 109.5 | 99.3 |
| G | 108.2 | 78.8 |
| H | 107.0 | 84.0 |
| I | 106.2 | 85.4 |
| J | 107.0 | 86.2 |
| K | 108.5 | 75.3 |
| L | 106.9 | 88.9 |
| M | 105.5 | 82.5 |
| N | 109.1 | 78.9 |
| O | 110.3 | 80.8 |
| P | 107.5 | 74.2 |
| Q | 110.5 | 74.6 |
| R | 107.1 | 92.0 |
| S | 108.2 | 90.1 |
| T | 106.0 | 76.0 |

Trench (groove) patterns with various sizes (sizes described in the "space size of resist before thickening" column of Table 3, i.e., 110 nm, 200 nm, 300 nm, and 500 nm) were formed with use of ArF resist ("AR1244J", manufactured by JSR Corporation), the resist pattern thickening materials T and P prepared as described above were applied over the trench (groove) patterns, respectively, by a spin coating method, first under the condition of 1,000 rpm/5 s, and then under the condition of 3,500 rpm/40 s, and baking was carried out under the condition of 110° C./60 s. Thereafter, the resist pattern thickening materials T and P were each rinsed with pure water for 60 seconds and unreacted portions with no interaction or mixing were removed to develop the resist pattern thickened by the resist pattern thickening materials T and P, respectively. Thus, thickened resist patterns were formed.

The reduced amounts (nm) of the sizes of the trench patterns formed by the resulting thickened resist patterns are shown in Table 3 together with the initial pattern sizes (the sizes of the space patterns formed by the resist patterns to be thickened before thickening, i.e., the "space size of resist before thickening" in Table 3). Note that, in Table 3, "T" and "P" correspond to the resist pattern thickening materials T and P.

TABLE 3

| Space size of resist before thickening (nm) | Reduced amount of space size after thickening (nm) | |
| --- | --- | --- |
| | Thickening material T | Thickening material P |
| 110 | 22.5 | 22.3 |
| 200 | 22.7 | 30.5 |
| 300 | 23.5 | 45.2 |
| 500 | 26.3 | 56.5 |

Hole patterns with various sizes (sizes described in the "space size of resist before thickening" column of Table 4, i.e., 110 nm, 200 nm, and 300 nm) were formed with use of ArF resist ("AR1244J", manufactured by JSR Corporation), the resist pattern thickening materials T and P were applied over the hole patterns, respectively, by a spin coating method, first under the condition of 1,000 rpm/5 s, and then under the condition of 3,500 rpm/40 s, and baking was carried out under the condition of 110° C./60 s. Thereafter, the resist pattern thickening materials T and P were each rinsed with pure water for 60 seconds and unreacted portions with no interaction or mixing were removed to develop the resist pattern thickened by the resist pattern thickening materials T and P, respectively. Thus, thickened resist patterns were formed.

The reduced amounts (nm) of the sizes of the space patterns formed by the resulting thickened resist patterns are shown in Table 4 together with the initial pattern sizes (the sizes of the space patterns formed by the resist patterns to be thickened before thickening, i.e., the "space size of resist before thickening" in Table 4). Note that, in Table 4, "T" and "P" correspond to the resist pattern thickening materials T and P.

TABLE 4

| Space size of resist before thickening (nm) | Reduced amount of space size after thickening (nm) | |
| --- | --- | --- |
| | Thickening material T | Thickening material P |
| 110 | 30 | 33.3 |
| 200 | 30.7 | 45.8 |
| 300 | 28.5 | 65.2 |

It was found that by using the resist pattern thickening material of the present invention in forming hole patterns, the inner diameter of the hole patterns could be reduced. In contrast, it was found that when the resist pattern thickening materials A and B as a comparative example were used for forming hole patterns, the inner diameters of the hole patterns were hardly varied, and thus could not be reduced (refer to Table 2).

Further, it was found that when the resist pattern thickening material T of the present invention was used in forming line-space patterns, the space widths (the intervals between the line patterns) in the lines and spaces pattern could be reduced and could be made to be uniformly fine; and when the resist pattern thickening material T of the present invention was used in forming hole patterns, the hole patterns could be thickened, and the inner diameters of the hole patterns could be reduced (refer to Tables 3 and 4).

In contrast, when the resist pattern thickening material P as a comparative example, which is a conventional resist pattern thickening material containing an uril crosslinking agent, was used in forming lines and spaces patterns and hole patterns, the reduced amount depended on the sizes of the line-space pattern and the hole pattern. The larger the size of the initial space pattern was, the more the reduced amount of the size of the space pattern after thickening increased, and thus, it was found that the lines and spaces pattern and the hole pattern could not be uniformly thickened (refer to Tables 3 and 4).

Hole patterns having openings or holes with an opening diameter of 580 nm were formed with use of non-chemically amplified type electron beam resist ("Nano 495 PMMA" manufactured by MicroChem Corp.) by electron beam exposure thereof, the resist pattern thickening material E of the present invention was applied over the hole patterns by a spin coating method, first under the condition of 1,000 rpm/5 s, and then under the condition of 3,500 rpm/40 s, and baking was carried out under the condition of 110° C./60 s. Thereafter, the resist pattern thickening material E was rinsed with pure water for 60 seconds and unreacted portions with no interaction or mixing were removed to develop the resist pattern thickened by the resist pattern thickening material E. Thus, thickened resist patterns were formed. The size of the space pattern formed by the resulting thickened resist patterns was 400 nm.

The resist pattern thickening material of the present invention could thicken a non-chemically amplified type electron beam resist as well. Thus, it was found that thickening was not caused by utilizing an acid in the resist pattern to be thickened and the interaction or mixing was not crosslinking reaction caused by acid diffusion.

Hole patterns having openings or holes with an opening diameter of 110 nm were formed with use of the ArF resist ("AR1244J" manufactured by JSR Corporation), the resist pattern thickening materials T and P of the present invention were applied over the hole patterns, respectively, by a spin coating method, first under the condition of 1,000 rpm/5 s, and then under the condition of 3,500 rpm/40 s. and baking was carried out under the condition of the various temperatures (the temperatures described in the "baking temperature" column of Table 5, i.e. 90° C., 110° C., 130° C. and 150° C. for 60 seconds. Thereafter, the resist pattern thickening materials T and P were rinsed with pure water for 60 seconds and unreacted portions with no interaction or mixing were removed to develop the resist patterns thickened by the resist pattern thickening materials T and P. Thus, thickened resist patterns were formed.

The reduced amounts (nm) of the sizes of the space patterns formed by the resulting thickened resist patterns are shown in Table 5 together with the baking temperature. Note that, in Table 5, "T" and "P" correspond to the resist pattern thickening materials T and P.

TABLE 5

| Baking temperature (° C.) | Reduced amount of space size after thickening (nm) | |
|---|---|---|
| | Thickening material T | Thickening material P |
| 90 | 21.0 | 18.5 |
| 110 | 30.0 | 33.3 |
| 130 | 35.5 | 58.2*2 |
| 150 | 43.3 | —*3 |

In Table 5, in case of "*2", residue remained, and in case of "*3", spaces or holes were closed due to crosslinking reaction.

From the results of Table 5, it was found that since thickening by the resist pattern thickening materials T did not utilize crosslinking reaction, acceptable range of baking temperature was broad and it could be efficiently used in a wide range of temperature. In contrast, when the resist pattern thickening material P as a comparative example, which is a conventional resist pattern thickening material containing an uril crosslinking agent was used in forming hole patterns, it was found that residue remained in the case where baking was carried out at 130° C., and spaces or holes were closed due to crosslinking reaction in the case where baking was carried out at 150° C.

The resist pattern thickening materials C, I, and K of the present invention were applied over the surfaces of resists formed on silicon substrates to form surface layers having a thickness of 0.5 μm. These surface layers, a KrF resist (UV-6, manufactured by Shipley Company, L.L.C) for comparison, and a poly(methyl methacrylate) (PMMA) for comparison were subjected to etching using an etching system (a parallel plate RIE system, manufactured by Fujitsu Limited), at Pμ of 200 W, a pressure of 0.02 Torr and a flow rate of $CF_4$ gas of 100 sccm for three minutes. The reductions in the samples were measured, the etching rates were calculated therefrom, and the etching rates of samples were compared with the etching rate of the KrF resist. The results are shown in Table 6.

TABLE 6

| Material | Etching rate (nm/min) | Ratio of etching rate to KrF resist |
|---|---|---|
| UV-6 | 630 | 1.00 |
| PMMA | 781 | 1.24 |
| C | 624 | 0.99 |
| I | 618 | 0.98 |
| K | 617 | 0.98 |

From the results of Table 6, it was found that the etch resistances of the resist pattern thickening materials of the present invention were near to that of the KrF resist and were markedly superior as compared with PMMA, since the resist pattern thickening materials of the present invention comprise a compound represented by the general formula (1) having an aromatic ring.

Example 2

Preparation of Resist Pattern Thickening Material

Resist pattern thickening materials 2A through 2D having the composition shown in Table 7 were prepared.

In Table 7, "thickening material" means a resist pattern thickening material, and "2A" through "2D" correspond to the resist pattern thickening materials 2A through 2D. In Table 7, the unit of the values in parentheses is parts by mass.

In the "compound represented by general formula (1)" column of the resist pattern thickening materials 2A through 2D, derivatives of benzyl alcohol are compounds represented by the above-mentioned general formula (1).

In the "resin" column, "PVA" is a polyvinyl alcohol resin ("PVA-205C" manufactured by Kuraray Co., Ltd.). In the "surfactant" column, "TN-80" is a non-ionic surfactant (a primary alcohol ethoxylate surfactant manufactured by Asahi Denka Co., Ltd.), and "PC-6" is a non-ionic surfactant (a polynuclear phenol ethoxylate surfactant manufactured by Asahi Denka Co., Ltd.).

As a solvent component, 96 gram of pure water (deionized water) was used.

TABLE 7

| Thickening material | Resin (Parts by mass) | Compound represented by general formula (1) (Parts by mass) | Solvent (Parts by mass) | Surfactant (Parts by mass) |
|---|---|---|---|---|
| 2A | PVA (4) | 2-hydroxybenzyl alcohol (1) | pure water (96) | TN-80 (0.06) |
| 2B | PVA (4) | 2-hydroxybenzyl alcohol (1) | pure water (96) | PC-6 (0.06) |
| 2C | PVA (4) | 2,4-dihydroxybenzyl alcohol (1) | pure water (96) | — |
| 2D | PVA (4) | 2-hydroxybenzyl alcohol (1) | pure water (96) | — |

—Preparation of Developing Solution—

Developing solutions 1 to 13 having the composition shown in Table 8 were prepared.

In Table 8, "TMAH" in the "fundamental solution" column, is a 2.38% by mass tetramethylammonium hydroxide aqueous solution (ZTMA100, manufactured by Zeon Corporation), which is an alkaline developing solution, and "choline" is a 4% by mass choline aqueous solution (CHOLINE, i.e., trimethyl 2-hydroxyethyl ammonium hydroxide, manufactured by Tama Chemicals Co., Ltd.). In the "surfactant" column, "TN-100" is a non-ionic surfactant (a primary alcohol ethoxylate surfactant manufactured by Asahi Denka Co., Ltd.), "KF-642" is a non-ionic surfactant (silicone surfactant, manufactured by Shin-Etsu Chemical Co., Ltd.), "PC-10" is a non-ionic surfactant (a polynuclear phenol ethoxylate surfactant manufactured by Asahi Denka Co., Ltd.), "L-44" is a polyoxyethylene-polyoxypropylene condensate surfactant (manufactured by Asahi Denka Co., Ltd.), "GH-200" is a polyoxyethylene alkylether surfactant (manufactured by Asahi Denka Co., Ltd.), "T-81" is a sorbitan fatty acid ester surfactant (manufactured by Asahi Denka Co., Ltd.), "LA-675" is a polyoxyethylene derivative surfactant (manufactured by Asahi Denka Co., Ltd.), "NK-7" is a glycerin fatty acid ester surfactant (manufactured by Asahi Denka Co., Ltd.), "TN-80" is a non-ionic surfactant (a primary alcohol ethoxylate surfactant manufactured by Asahi Denka Co., Ltd.), and "PC-8" is a non-ionic surfactant (a polynuclear phenol ethoxylate surfactant, manufactured by Asahi Denka Co., Ltd.). Further, "% by mass" represents the content of the surfactant to the fundamental solution.

TABLE 8

| Developing solution number | Fundamental solution | Surfactant (% by mass) |
|---|---|---|
| 1 | Pure water | — |
| 2 | Pure water | TN-100 (0.01) |
| 3 | Pure water | KF-642 (0.005) |
| 4 | Pure water | PC-10 (0.02) |
| 5 | Pure water | L-44 (0.01) |
| 6 | Pure water | GH-200 (0.005) |
| 7 | Pure water | T-81 (0.02) |
| 8 | Pure water | LA-675 (0.01) |
| 9 | Pure water | NK-7 (0.004) |
| 10 | TMAH | — |
| 11 | TMAH | TN-80 (0.01) |
| 12 | Choline | — |
| 13 | Choline | PC-8 (0.01) |

—Formation of Resist Pattern—

The resist pattern thickening materials 2A through 2D of the present invention prepared as described above were applied over the hole patterns (each having the opening diameter shown in "space size of resist before thickening" in Table 9), which was formed by the ArF resist ("AR1244J" manufactured by JSR Corporation), by a spin coating method, first under the condition of 1,000 rpm/5 s, and then under the condition of 3,500 rpm/40 s. Thereafter, baking was carried out under the condition of 110° C./60 s.

Then, the resist pattern thickening materials 2A through 2D each were rinsed for 60 seconds using the developing solutions 1 to 13 prepared as described above, and unreacted portions with no interaction or mixing were removed to develop the resist pattern thickened by the resist pattern thickening materials 2A through 2D, respectively. Thus, thickened resist patterns were formed.

The sizes of the space patterns formed by the resulting thickened resist patterns (the "space size of resist after thickening" in Table 9) are shown in Table 9 together with the initial pattern sizes (the sizes of the space patterns formed by the resist patterns to be thickened before thickening, i.e., the "space size of resist before thickening" in Table 9). Note that, in Table 9, "2A" through "2D" correspond to the resist pattern thickening materials 2A through 2D. Further, in the "space size of resist before thickening" and "space size of resist after thickening" columns, values in parentheses represent 3σ (three times of standard deviation), and smaller value means that variation of space size is small.)

TABLE 9

| Thickening material | Space size of resist before thickening (nm) (3σ) | Developing solution number | Space size of resist after thickening (nm) (3σ) |
|---|---|---|---|
| 2A | 85.5 (13.2) | 1 | 71.2 (9.3) |
| 2A | 87.3 (13.0) | 2 | 70.2 (6.5) |
| 2A | 86.0 (12.5) | 10 | 72.5 (7.9) |
| 2A | 89.2 (12.7) | 11 | 73.9 (5.3) |
| 2A | 91.5 (11.2) | 5 | 73.2 (6.5) |
| 2A | 89.3 (13.0) | 6 | 74.2 (6.1) |
| 2A | 90.0 (12.5) | 7 | 73.5 (7.0) |
| 2B | 86.0 (12.5) | 1 | 71.0 (9.5) |
| 2B | 87.2 (12.5) | 3 | 71.9 (7.2) |
| 2B | 86.6 (12.6) | 12 | 74.0 (7.0) |
| 2B | 87.0 (12.4) | 13 | 74.3 (5.2) |
| 2B | 89.2 (12.7) | 8 | 71.9 (5.9) |
| 2B | 90.8 (12.0) | 9 | 72.3 (7.2) |
| 2C | 85.6 (13.4) | 1 | 77.5 (10.8) |
| 2C | 86.1 (12.2) | 4 | 77.6 (9.0) |
| 2C | 87.2 (12.4) | 10 | 79.5 (6.6) |
| 2C | 86.8 (13.0) | 11 | 80.0 (5.2) |
| 2D | 88.3 (12.0) | 1 | 82.0 (10.8) |
| 2D | 87.1 (12.3) | 2 | 81.3 (9.2) |
| 2D | 85.9 (12.8) | 12 | 80.8 (8.6) |
| 2D | 86.4 (12.3) | 13 | 81.1 (7.2) |

From the results of Table 9, it was found that, compared with the case where only pure water was used as a developing solution, in the cases where pure water containing a surfactant was used and where an alkaline developing solution was used, variation (3σ) of the space size after thickening was small, the resist pattern could be uniformly thickened, and space patterns having a uniform size could be obtained stably.

Example 3

Preparation of Resist Pattern Thickening Material

Resist pattern thickening materials 3A through 3E having the compositions shown in Table 10 were prepared.

Note that, in Table 10, the "thickening material" means a resist pattern thickening material, and "3A" through "3E" correspond to the resist pattern thickening materials 3A through 3E. Note that, in Table 10, the unit of the values in parentheses is parts by mass.

In the "compound represented by the general formula (1)" column of the resist pattern thickening materials 3A through 3E, derivatives of benzyl alcohol are compounds represented by the above-mentioned general formula (1).

In the "resin" column, "PVA" is a polyvinyl alcohol resin ("PVA-205C" manufactured by Kuraray Co., Ltd.) and "KW-3" is a polyvinyl acetal resin (manufactured by Sekisui Chemical Co., Ltd.). In the "surfactant" column, "PC-6" is a non-ionic surfactant (a polynuclear phenol ethoxylate surfactant manufactured by Asahi Denka Co., Ltd.), and "TN-80" is a non-ionic surfactant (a primary alcohol ethoxylate surfactant manufactured by Asahi Denka Co., Ltd.).

In the resist pattern thickening materials 3A through 3D, 95 gram of pure water (deionized water) was used as the solvent component. In the resist pattern thickening material 3E, a mixed solution of pure water (deionized water) and isopropyl alcohol as the organic solvent (whose mass (g) ratio was pure water (deionized water):isopropyl alcohol=98.6 (g): 0.4 (g)) was used as the solvent component.

The sizes (diameters) of the hole patterns formed by the resulting thickened resist patterns are shown in Table 11 together with the initial pattern sizes (the sizes of the hole patterns formed by the resist patterns to be thickened before thickening, i.e., the "space size (hole diameter) of resist before thickening" in Table 11). Note that, in Table 11, "3A" through "3E" correspond to the resist pattern thickening materials 3A through 3E.

TABLE 11

| Thickening material | Space size (hole diameter) of resist before thickening (nm) | Space size (hole diameter) of resist after thickening (nm) |
| --- | --- | --- |
| 3A | 109.3 | 87.4 |
| 3B | 108.0 | 79.3 |
| 3C | 109.0 | 99.1 |
| 3D | 106.5 | 88.0 |
| 3E | 108.4 | 78.7 |

From the results of Table 11, it was found that the resist pattern thickening materials 3A through 3D of the present invention each thickened a resist pattern, enabling the reduction of the inner diameter of the hole patterns.

—Formation of Resist Pattern—

Figure 46:
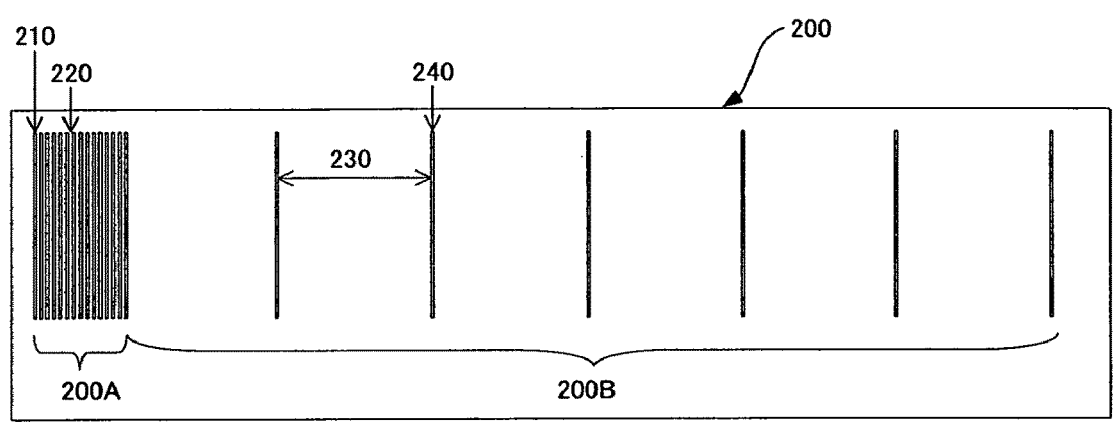
FIG. 46 is a schematic diagram showing a pattern layout of the reticle used in Example 3.

By using the reticle with different intervals of pattern shown in FIG. 46, which has sparse regions of resist pattern (regions where the pitch of resist pattern is long) and dense regions of the resist pattern (regions where the pitch of resist pattern is short), the ArF resist ("AR1244J", manufactured by JSR Corporation) was irradiated with ArF excimer laser light, and then developed to form resist patterns.

Here, the reticle 200 shown in FIG. 46 has a large difference in the density of patterns. The reticle 200 has a pattern (line-space pattern) in which reticle size of a 120 nm space 210 and a 120 nm line 220 repeats 50 times, in a dense pattern

TABLE 10

| Thickening material | Resin (Parts by mass) | Compound represented by general formula (1) (Parts by mass) | Solvent (Parts by mass) | Surfactant (Parts by mass) |
| --- | --- | --- | --- | --- |
| 3A | PVA (4) | 2-hydroxybenzyl alcohol (2) | pure water (95) | — |
| 3B | PVA (4) | 2-hydroxybenzyl alcohol (2) | pure water (95) | PC-6 (0.05) |
| 3C | PVA (4) | 4-hydroxybenzyl alcohol (2) | pure water (95) | — |
| 3D | PVA (4) | 2-aminobenzyl alcohol (2) | pure water (95) | — |
| 3E | KW-3 (16) | 2-hydroxybenzyl alcohol (1.5) | pure water (98.6) + IPA (0.4) | TN-80 (0.1) |

—Experiment of Thickening Resist Pattern—

The resist pattern thickening materials 3A through 3E of the present invention which were prepared as described above were applied over hole patterns (each having the opening diameter shown in "Space size of resist before thickening" in Table 11) formed by the ArF resist ("AR1244J", manufactured by JSR Corporation), by a spin coating method, first under the condition of 1,000 rpm/5 s, and then under the condition of 3,500 rpm/40 s. Thereafter, baking was carried out under the condition of 110° C./60 s. Then, the resist pattern thickening materials 3A through 3E each were rinsed for 60 seconds with pure water and unreacted portions with no interaction or mixing were removed to develop the resist pattern thickened by the resist pattern thickening materials 3A through 3E, respectively. Thus, thickened resist patterns were formed.

portion 200A; and a pattern (trench pattern) in which reticle size of 12,000 nm (12 μm) line 230 and a 120 nm space 240 repeats 50 times, in a sparse pattern portion 200B. The pattern layout is such that these patterns are exposed at the same time by one shot irradiation with exposure light.

Then, by using the obtained resist patterns to be thickened, thickened resist patterns were formed in a similar way as in the experiment of thickening resist pattern. In this case, pre-treatment exposure, in which the entire surface of the resist pattern to be thickened is irradiated with exposure light, was not carried out before applying the resist pattern thickening material over the resist pattern to be thickened.

The amounts of change in the space size of resist formed by the resulting thickened resist patterns (Reduced amount (nm); difference between "space size of resist before thickening" and "space size of resist after thickening") are shown in Table 12, with respect to the dense pattern portion and sparse pattern portion. Note that, in Table 12, "3A" through "3E" correspond to the resist pattern thickening materials 3A through 3E.

TABLE 12

| | Amount of change in the space size of resist in the case where pre-treatment exposure was not preformed (nm) | |
|---|---|---|
| Thickening material | Recuced amout of space size of resist in dense pattern portion (nm) | Recuced amout of space size of resist in sparse pattern portion (nm) |
| 3A | 20.0 | 12.4 |
| 3B | 27.5 | 17.0 |
| 3C | 8.6 | 6.6 |
| 3D | 18.0 | 11.9 |
| 3E | 28.9 | 16.4 |

From the results of Table 12, it was found that use of any resist pattern thickening material resulted in the decrease of the reduced amount of space size of resist in the 120 nm trench pattern located in the sparse pattern portion compared to the reduced amount of space size of resist in the 120 nm line-space pattern located in the dense pattern portion, and was found that when the pre-treatment exposure was not carried out, 1.3 fold- to 1.8-fold differences in the amount of thickening resist pattern were generated depending on the density of resist pattern.

Further, by using the reticle shown in FIG. 46, the ArF resist ("AR1244J", manufactured by JSR Corporation) was irradiated with ArF excimer laser light so that the exposure dose was 42.0 mJ/cm$^2$, and then developed to form resist patterns.

Next, the entire surface of the obtained resist pattern was irradiated with ArF excimer laser light so that the exposure dose was 2.5 mJ/cm$^2$ (corresponds to the "pre-treatment exposure). Immediately after the irradiation, the resist pattern thickening materials 3A through 3E of the present invention shown in Table 10 were applied over the resist pattern to be thickened, by a spin coating method, first under the condition of 1,000 rpm/5 s, and then under the condition of 3,500 rpm/40 s. Thereafter, baking was carried out under the condition of 110° C./60 s. Then, the resist pattern thickening materials 3A through 3E each were rinsed for 60 seconds with pure water and unreacted portions with no interaction or mixing were removed to develop the resist pattern thickened by the resist pattern thickening materials 3A through 3E, respectively. Thus, thickened resist patterns were formed.

The amounts of change in the space size of resist formed by the resulting thickened resist patterns (Reduced amount (nm); difference between "space size of resist before thickening" and "space size of resist after thickening") are shown in Table 13, with respect to the dense pattern portion and sparse pattern portion. Note that, in Table 13, "3A" through "3E" correspond to the resist pattern thickening materials 3A through 3E.

TABLE 13

| | Amount of change in the space size of resist in the case where pre-treatment exposure was preformed (nm) | |
|---|---|---|
| Thickening material | Recuced amout of space size of resist in dense pattern portion (nm) | Recuced amout of space size of resist in sparse pattern portion (nm) |
| 3A | 22.0 | 19.0 |
| 3B | 29.5 | 26.8 |
| 3C | 10.9 | 9.6 |
| 3D | 21.1 | 19.3 |
| 3E | 30.0 | 26.4 |

From the results of Table 13, it was found that use of any resist pattern thickening material made little difference between the reduced amount of space size of resist in the 120 nm line-space pattern located in the dense pattern portion and the reduced amount of space size of resist in the 120 nm trench pattern located in the sparse pattern portion, and by carrying out the pre-treatment exposure, resist pattern could be uniformly thickened without depending on the density of resist pattern.

Further, in a similar way, by using the reticle shown in FIG. 46, ArF resist ("AX5910", manufactured by Sumitomo Chemical Co., Ltd.) as the acrylic resist having an alicyclic functional group at the side chain thereof was irradiated with ArF excimer laser light so that the exposure dose was 39.5 mJ/cm$^2$, and then developed to form resist patterns.

Next, resist pattern thickening materials 3A, 3B and 3D shown in Table 11 were applied over the obtained resist pattern to be thickened, and thickened resist patterns were formed, respectively. Here, the thickened resist patterns were formed in two aspects: one in which the pre-treatment exposure was not carried out before applying the resist pattern thickening material over the resist pattern to be thickened; and the other in which the pre-treatment exposure was carried out (the exposure dose in the pre-treatment exposure was 2.3 mJ/cm$^2$). Results are shown in Tables 14 and 15, respectively.

TABLE 14

| | Amount of change in the space size of resist in the case where pre-treatment exposure was not preformed (nm) | |
|---|---|---|
| Thickening material | Recuced amout of space size of resist in dense pattern portion (nm) | Recuced amout of space size of resist in sparse pattern portion (nm) |
| 3A | 15.1 | 9.2 |
| 3B | 20.8 | 13.6 |
| 3D | 13.9 | 7.6 |

From the results of Table 14, it was found that use of any resist pattern thickening material resulted in the decrease of the reduced amount of space size of resist in the 120 nm trench pattern located in the sparse pattern portion compared to the reduced amount of space size of resist in the 120 nm line-space pattern located in the dense pattern portion, and was found that when the pre-treatment exposure was not carried out, 1.5 fold- to 1.8 fold-differences in the amount of thickening resist pattern were generated depending on the density of resist pattern.

TABLE 15

| Thickening material | Amount of change in the space size of resist in the case where pre-treatment exposure was preformed (nm) | |
| --- | --- | --- |
| | Recuced amout of space size of resist in dense pattern portion (nm) | Recuced amout of space size of resist in sparse pattern portion (nm) |
| 3A | 18.3 | 16.9 |
| 3B | 23.9 | 21.3 |
| 3D | 16.6 | 14.4 |

From the results of Table 15, it was found that use of any resist pattern thickening material made little difference between the reduced amount of space size of resist in the 120 nm line-space pattern located in the dense pattern portion and the reduced amount of space size of resist in the 120 nm trench pattern located in the sparse pattern portion, and by carrying out the pre-treatment exposure, resist pattern could be uniformly thickened without depending on the density of resist pattern.

Example 4

Figure 9:
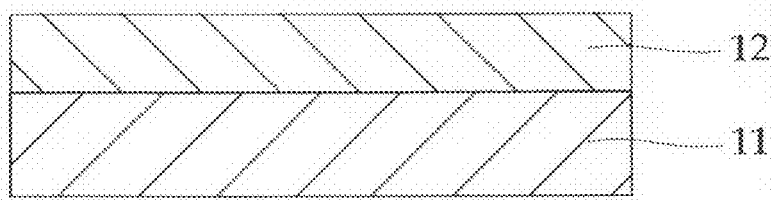
FIG. 9 is a schematic diagram for explaining an example of a process for manufacturing a semiconductor device of the present invention, and showing the state where an interlayer dielectric film is formed on a silicon substrate.
Figure 10:
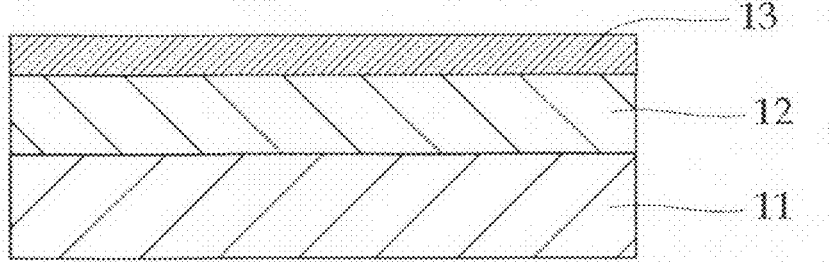
FIG. 10 is a schematic diagram for explaining an example of a process for manufacturing a semiconductor device of the present invention, and showing the state where a titanium film is formed on the interlayer dielectric film.
Figure 11:
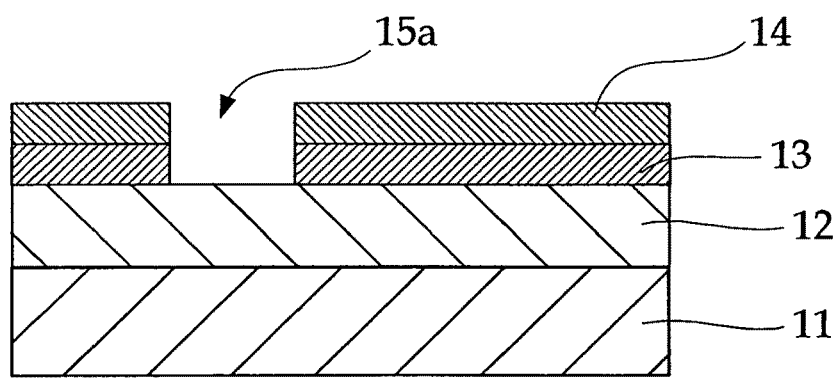
FIG. 11 is a schematic diagram for explaining an example of a process for manufacturing a semiconductor device of the present invention, and showing the state where a resist film is formed on the titanium film and a hole pattern is formed on the titanium film.
Figure 12:
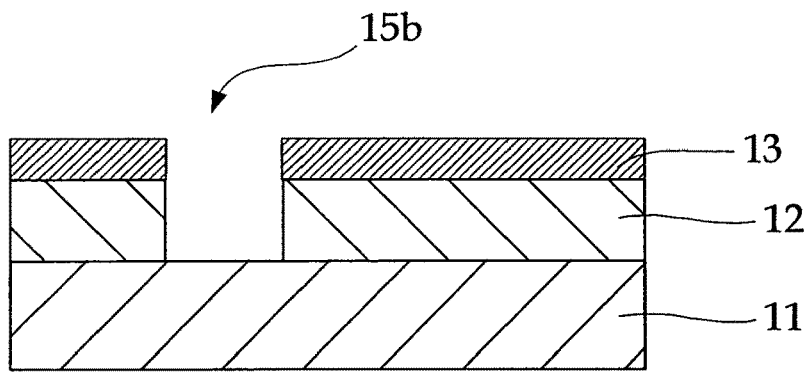
FIG. 12 is a schematic diagram for explaining an example of a process for manufacturing a semiconductor device of the present invention, and showing the state where the hole pattern is also formed on the titanium film.

As shown in FIG. 9, an interlayer dielectric film 12 was formed on a silicon substrate 11, and as shown in FIG. 10, a titanium film 13 was formed by a sputtering method on the interlayer dielectric film 12. Next, as shown in FIG. 11, a resist pattern 14 was formed by a known photolithographic technique. By using the resist pattern 14 as a mask, the titanium film 13 was patterned by reactive ion etching to form openings 15a. Reactive ion etching was continuously carried out to remove the resist pattern 14, at the same time, as shown in FIG. 12, openings 15b were formed in the interlayer dielectric film 12 by using the titanium film 13 as a mask.

Figure 13:
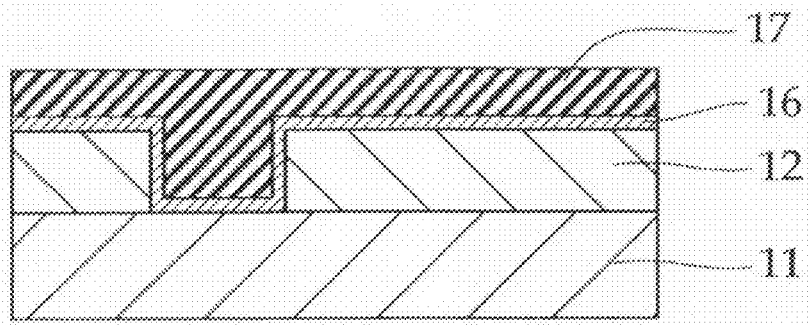
FIG. 13 is a schematic diagram for explaining an example of a process for manufacturing a semiconductor device of the present invention, and showing the state where a Cu film is formed on the interlayer dielectric film having the hole pattern.
Figure 14:
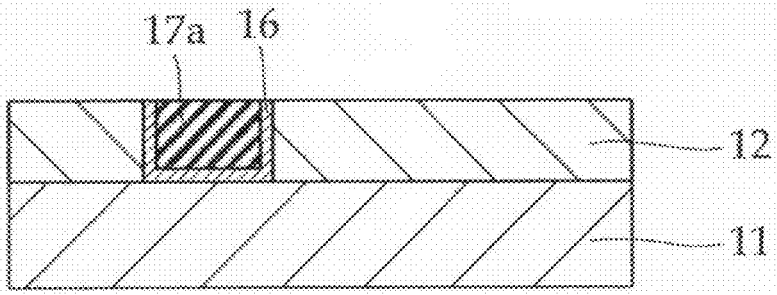
FIG. 14 is a schematic diagram for explaining an example of a process for manufacturing a semiconductor device of the present invention, and showing the state where the copper is removed except the layer on the hole pattern of the interlayer dielectric film.

Next, the titanium film 13 was removed by wet processing, and as shown in FIG. 13, a TiN film 16 was formed on the interlayer dielectric film 12 by a sputtering method. Subsequently, a Cu film 17 was grown by an electrolytic plating method on the TiN film 16. Next, as shown in FIG. 14, planarizing was carried out by CMP such that the barrier metal and the Cu film (first metal film) remained only in the groove portions corresponding to the openings 15b (FIG. 12), and wires 17a of a first layer were formed.

Figure 15:
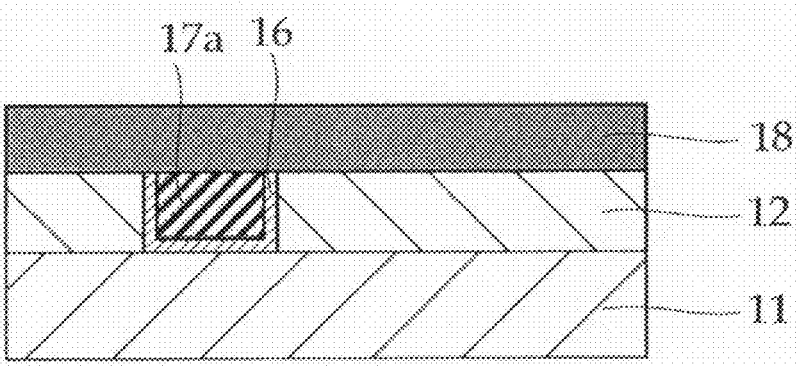
FIG. 15 is a schematic diagram for explaining an example of a process for manufacturing a semiconductor device of the present invention, and showing the state where an interlayer dielectric film is formed on the Cu plug formed inside of the hole pattern, and on the interlayer dielectric film.
Figure 16:
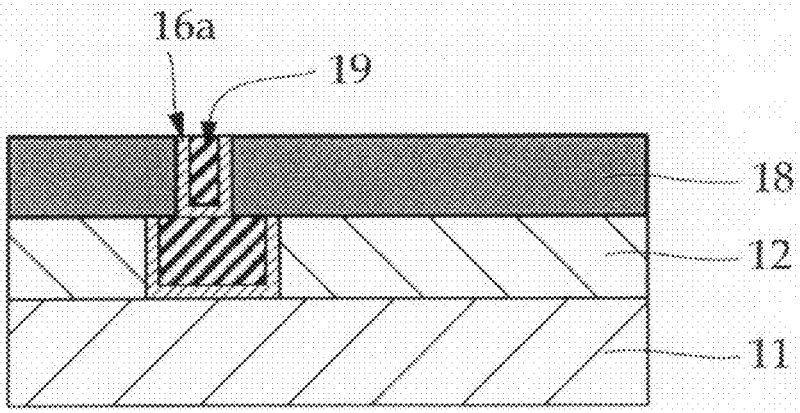
FIG. 16 is a schematic diagram for explaining an example of a process for manufacturing a semiconductor device of the present invention, and showing the state where a hole pattern is formed on the interlayer dielectric film as a surface layer and a Cu plug is formed therein.

Next, as shown in FIG. 15, an interlayer dielectric film 18 was formed on the wires 17a of the first layer. Thereafter, in the same way as in FIGS. 9 through 14, Cu plugs (second metal films) 19 and TiN films 16a, which connected the wires 17a of the first layer to upper layer wires which would be formed later, were formed as shown in FIG. 16.

Figure 17:
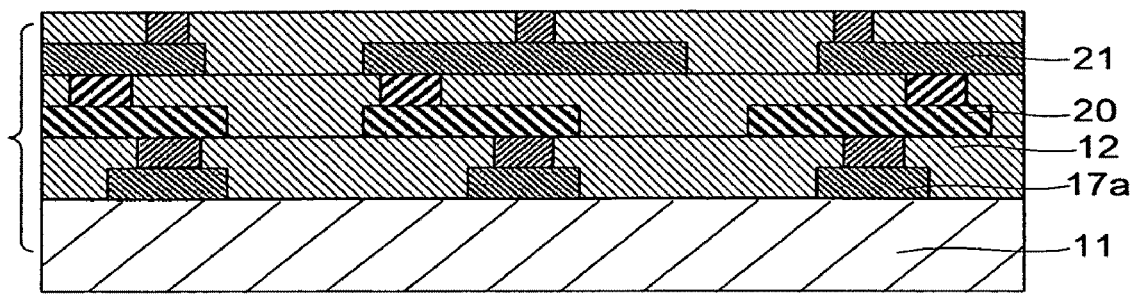
FIG. 17 is a schematic diagram for explaining an example of a process for manufacturing a semiconductor device of the present invention, and showing the state where a three-layered wiring is formed.

By repeating the above-described respective processes, as shown in FIG. 17, a semiconductor device was manufactured which had a multilayer wiring structure having, on the silicon substrate 11, the wires 17a of the first layer, wires 20 of a second layer, and wires 21 of a third layer. Note that the barrier metal layers formed beneath the wires of the respective layers are not shown in FIG. 17.

In present Example 4, the resist pattern 14 is the thickened resist pattern formed in the same way as in the case of Examples 1 to 3, by using the resist pattern thickening material of the present invention.

Example 5

Flash Memory and Manufacture Thereof

Example 5 illustrates an embodiment of the semiconductor device and the manufacturing process thereof of the present invention using a resist pattern thickening material of the present invention. In Example 5, resist films 26, 27, 29 and 32 are ones thickened by the same method as in Examples 1 to 3 using the resist pattern thickening material of the present invention.

Figure 18:
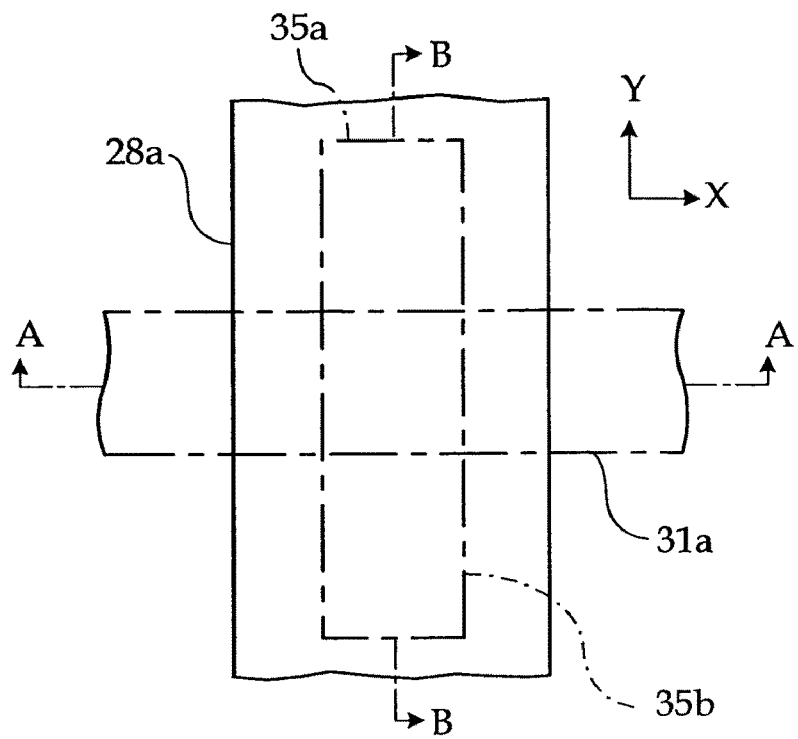
FIG. 18 is a top view for explaining a FLASH EPROM which is one example of a semiconductor device of the present invention.
Figure 19:
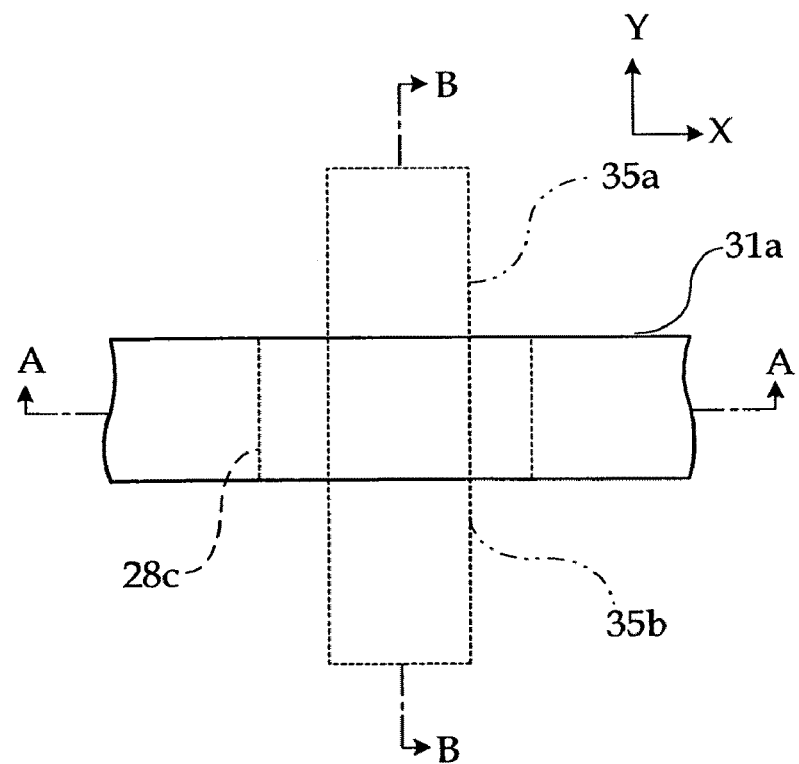
FIG. 19 is a top view for explaining a FLASH EPROM which is another example of a semiconductor device of the present invention.

FIGS. 18 and 19 are top views (plan views) of a FLASH EPROM which is called a FLOTOX type or an ETOX type. FIGS. 20 through 28 are schematic sectional views showing a manufacturing process of the FLASH EPROM. In these figures, the left views are schematic sectional views (sectional views taken along lines A-A) of a memory cell unit (a first element region), in a gate width direction (in the X direction in FIGS. 18 and 19), in a portion where a MOS transistor having a floating gate electrode is to be formed. The central views are schematic sectional views (sectional views taken along lines B-B) of the memory cell unit in a gate length direction (in the Y direction in FIGS. 18 and 19) perpendicular to the X direction in the same portion in the left views. The right views are schematic sectional views (sectional views taken along the line A-A in FIGS. 18 and 19) of a portion on which a MOS transistor is to be formed in a peripheral circuit unit (a second element region).

Figure 20:
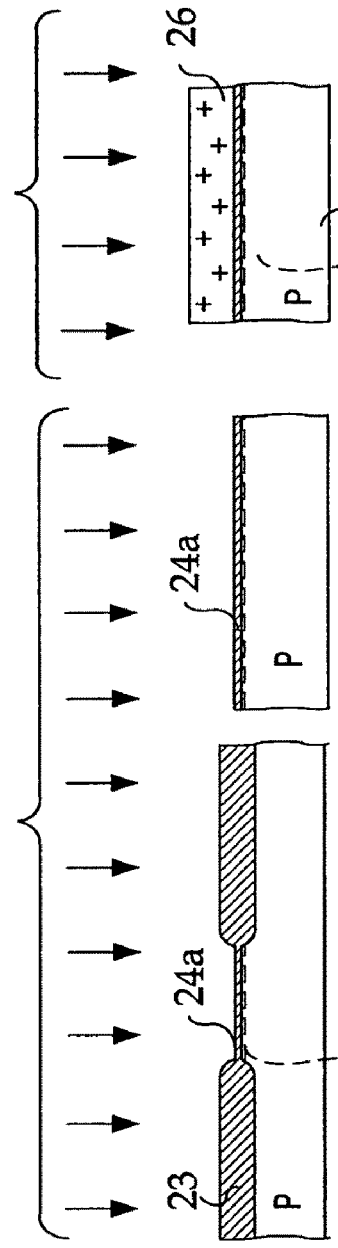
FIG. 20 is a cross-sectional schematic diagram for explaining a process for manufacturing the FLASH EPROM which is an example of the process for manufacturing a semiconductor device of the present invention.

Initially, a $SiO_2$ film was selectively formed in a device isolation region on a p-type Si substrate 22 and thereby yielded a field oxide film 23 of $SiO_2$ film (FIG. 20). Next, a $SiO_2$ film was formed by thermal oxidation to a thickness of 10 to 30 nm (100 to 300 angstroms) as a first gate dielectric film 24a in the MOS transistor in the memory cell unit (first element region). In another step, a $SiO_2$ film was formed by thermal oxidation to a thickness of 10 to 50 nm (100 to 500 angstroms) as a second gate dielectric film 24b in the MOS transistor in the peripheral circuit unit (second element region). If the first gate dielectric film 24a and the second gate dielectric film 24b should have the same thickness, these oxide films may be simultaneously formed in one step.

Next, the peripheral circuit unit (the right view in FIG. 20) was masked by a resist film 26 to control a threshold voltage for the formation of a MOS transistor having n-type depletion type channels in the memory cell unit (the left and central views in FIG. 20). As an n-type dopant, phosphorus (P) or arsenic (As) was injected into a region to be a channel region directly below the floating gate electrode by ion implantation at a dose of $1\times10^{11}$ to $1\times10^{14}$ $cm^{-2}$ and thereby yielded a first threshold control layer 25a. The dose and conduction type of the dopant can be appropriately selected depending on whether the channel is a depletion type or an accumulation type.

Figure 21:
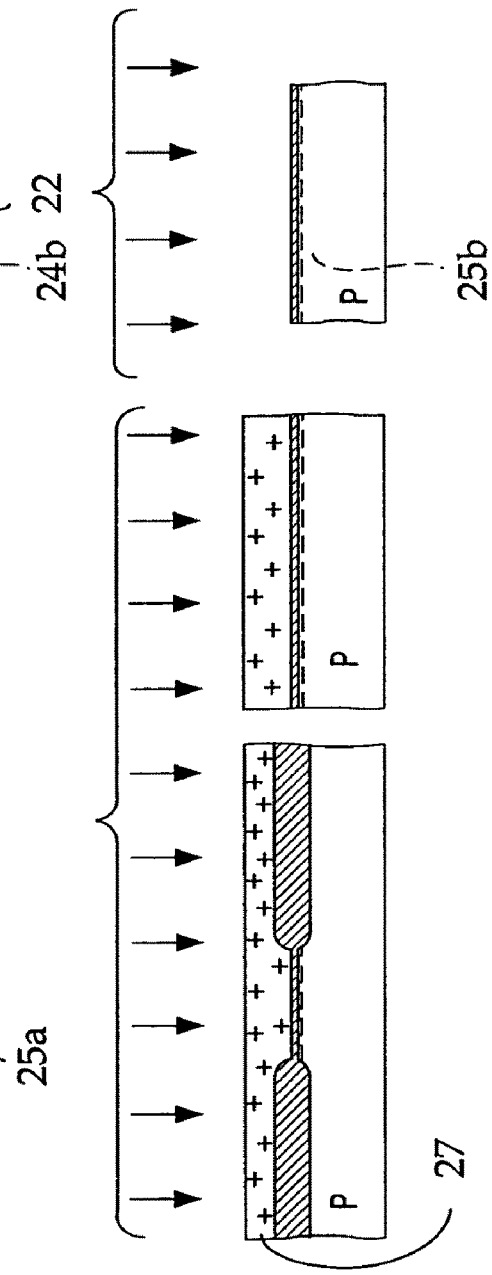
FIG. 21 is a cross-sectional schematic diagram for explaining a process for manufacturing the FLASH EPROM which is an example of the process for manufacturing a semiconductor device of the present invention, and showing a step after the step shown in FIG. 20.

Next, the memory cell unit (the left and central views in FIG. 21) was masked by a resist film 27 to control a threshold voltage for the formation of a MOS transistor having n-type depletion type channels in the peripheral circuit unit (the right view in FIG. 21). As an n-type dopant, phosphorus (P) or arsenic (As) was injected into a region to be a channel region directly below the gate electrode by ion implantation at a dose of $1\times10^{11}$ to $1\times10^{14}$ $cm^{-2}$ and thereby yielded a second threshold control layer 25b.

Figure 22:
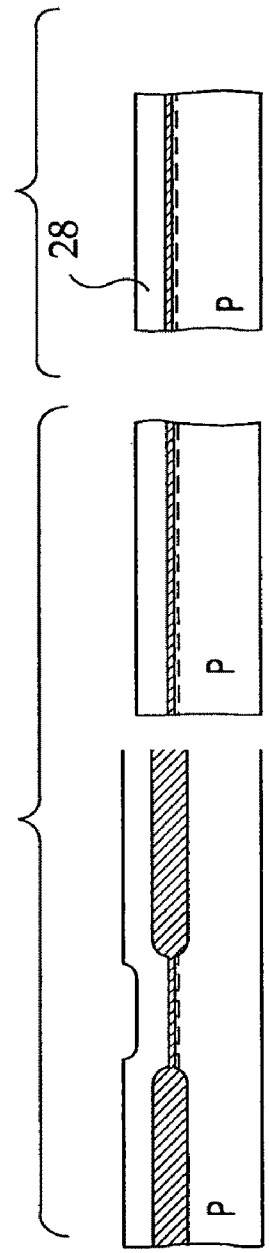
FIG. 22 is a cross-sectional schematic diagram for explaining a process for manufacturing the FLASH EPROM which is an example of the process for manufacturing a semiconductor device of the present invention, and showing a step after the step shown in FIG. 21.

A first polysilicon film (first conductive film) 28 having a thickness of 50 to 200 nm (500 to 2,000 angstroms) was formed on the entire surface of the article as a floating gate electrode of the MOS transistor of the memory cell unit (the left and central views in FIG. 22) and as a gate electrode of the MOS transistor in the peripheral circuit unit (the right view in FIG. 22).

Figures 23, 24, 25:
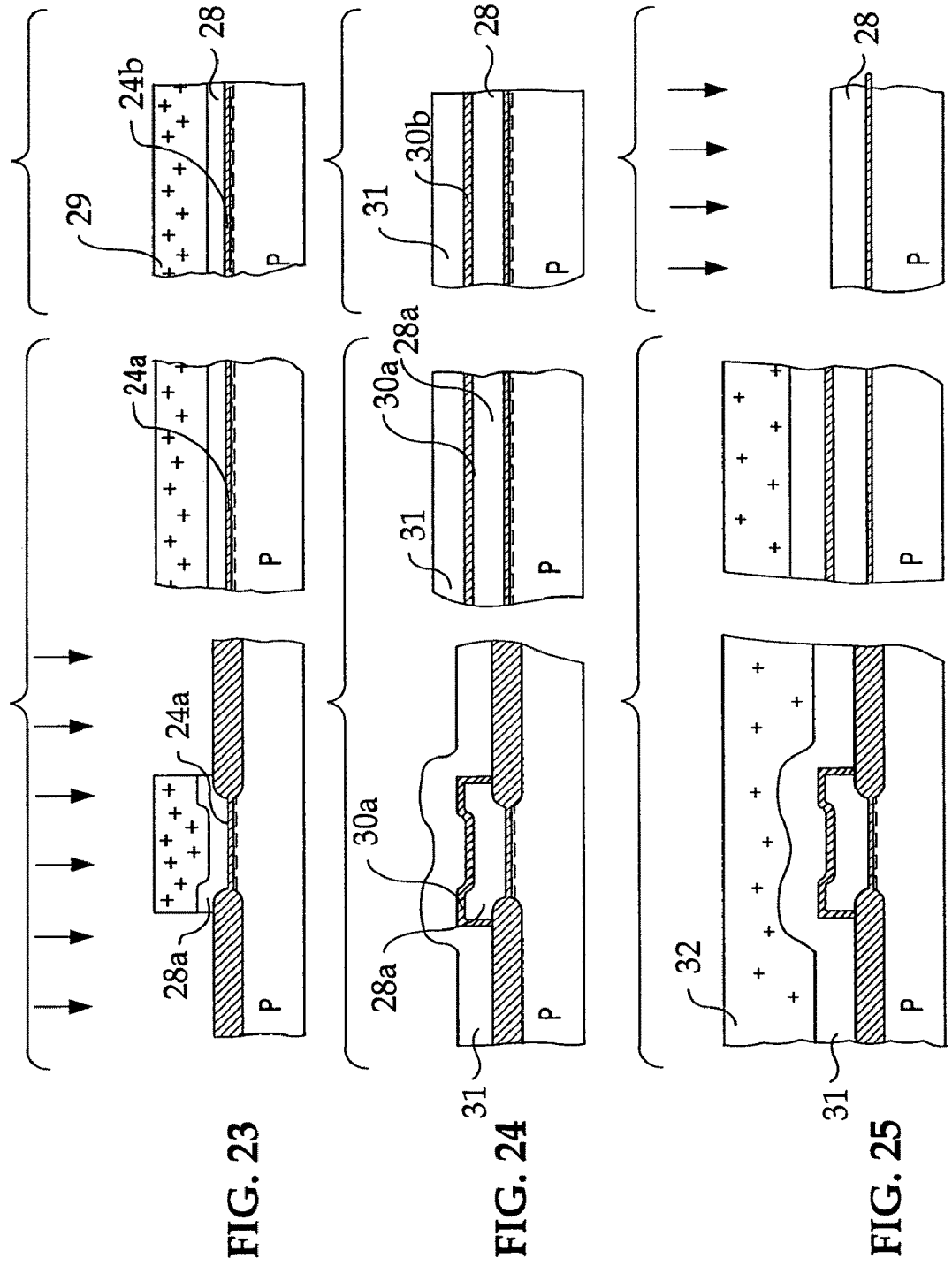
FIG. 23 is a cross-sectional schematic diagram for explaining a process for manufacturing the FLASH EPROM which is an example of the process for manufacturing a semiconductor device of the present invention, and showing a step after the step shown in FIG. 22.
FIG. 24 is a cross-sectional schematic diagram for explaining a process for manufacturing the FLASH EPROM which is an example of the process for manufacturing a semiconductor device of the present invention, and showing a step after the step shown in FIG. 23.
FIG. 25 is a cross-sectional schematic diagram for explaining a process for manufacturing the FLASH EPROM which is an example of the process for manufacturing a semiconductor device of the present invention, and showing a step after the step shown in FIG. 24.

With reference to FIG. 23, a resist film 29 was then formed, the first polysilicon film 28 was patterned using the resist film 29 as a mask and thereby yielded a floating gate electrode 28a in the MOS transistor in the memory cell unit (the left and central views in FIG. 23). In this procedure, the first polysilicon film 28 was patterned in the X direction to be intended dimensions and was not patterned in the Y direction to thereby leave a region to be a source-drain (S/D) layer covered by the resist film 29.

The resist film 29 was stripped, a $SiO_2$ film having a thickness of about 20 to 50 nm (200 to about 500 angstroms) was formed by thermal oxidation and thereby yielded a capacitor dielectric film 30a so as to cover the floating gate electrode 28a (the left and central views in FIG. 24). In this procedure, a capacitor dielectric film 30b made of a $SiO_2$ film was also formed on the first polysilicon film 28 in the peripheral circuit unit (the right view in FIG. 24). These capacitor dielectric films 30a and 30b are made of a $SiO_2$ film alone but they may comprise a multilayer film having two or three layers of $SiO_2$ film and $Si_3N_4$ film.

Next, a second polysilicon film (second conductive film) 31 was formed to a thickness of 50 to 200 nm (500 to 2,000 angstroms) so as to cover the floating gate electrode 28a and the capacitor dielectric film 30a (FIG. 24). The second polysilicon film 31 serves as a control gate electrode.

With reference to FIG. 25, the memory cell unit (the left and central views in FIG. 25) was masked by a resist film 32, the second polysilicon film 31 and the capacitor dielectric film 30b in the peripheral circuit unit (the right view in FIG. 25) were stripped in turn by etching to thereby expose the first polysilicon film 28 from the surface.

Figures 26, 27, 28:
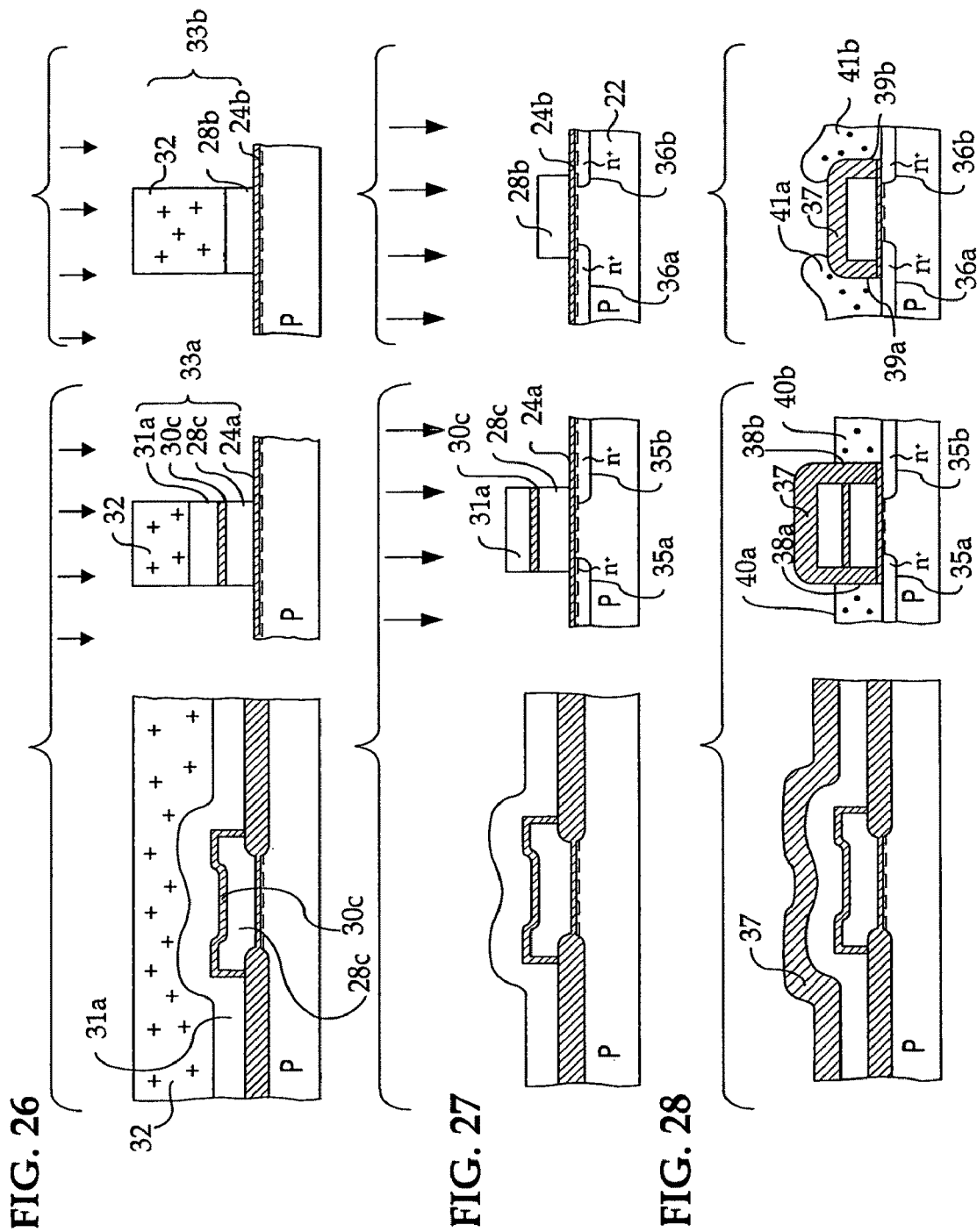
FIG. 26 is a cross-sectional schematic diagram for explaining a process for manufacturing the FLASH EPROM which is an example of the process for manufacturing a semiconductor device of the present invention, and showing a step after the step shown in FIG. 25.
FIG. 27 is a cross-sectional schematic diagram for explaining a process for manufacturing the FLASH EPROM which is an example of the process for manufacturing a semiconductor device of the present invention, and showing a step after the step shown in FIG. 26.
FIG. 28 is a cross-sectional schematic diagram for explaining a process for manufacturing the FLASH EPROM which is an example of the process for manufacturing a semiconductor device of the present invention, and showing a step after the step shown in FIG. 27.

With reference to FIG. 26, the second polysilicon film 31, the capacitor dielectric film 30a, and the first polysilicon film 28a of the memory cell unit (the left and central views in FIG. 26), which first polysilicon film 28a had been patterned only in the X direction, were patterned in the Y direction to target dimensions of a first gate unit 33a using the resist film 32 as a mask. Thus, a multilayer assemblage of a control gate electrode 31a, a capacitor dielectric film 30c, and a floating gate electrode 28c having a width of about 1 μm in the Y direction was formed. In addition, the first polysilicon film 28 in the peripheral circuit unit (the right view in FIG. 26) was patterned to target dimensions of a second gate unit 33b and thereby yielded a gate electrode 28b about 1 μm wide.

Phosphorus (P) or arsenic (As) was injected into the element forming region of the Si substrate 22 by ion implantation at a dose of $1\times10^{14}$ to $1\times10^{16}$ cm$^{-2}$ using, as a mask, the multilayer assemblage of the control gate electrode 31a, the capacitor dielectric film 30c, and the floating gate electrode 28c in the memory cell unit (the left and central views in FIG. 27) and thereby yielded n-type source and drain (S/D) region layers 35a and 35b. In addition, phosphorus (P) or arsenic (As) as an n-type dopant was injected into the element forming region of the Si substrate 22 by ion implantation at a dose of $1\times10^{14}$ to $1\times10^{16}$ cm$^{-2}$ using the gate electrode 28b in the peripheral circuit unit (the right view in FIG. 27) as a mask and thereby yielded S/D region layers 36a and 36b.

A phosphate-silicate glass film (PSG film) about 500 nm (5000 angstroms) thick was formed as an interlayer dielectric film 37 so as to cover the first gate unit 33a in the memory cell unit (the left and central views in FIG. 28) and the second gate unit 33b in the peripheral circuit unit (the right view in FIG. 28).

Subsequently, contact holes 38a, 38b, 39a, and 39b were formed on the interlayer dielectric film 37 on the S/D region layers 35, 35b, 36a, and 36b, respectively. S/D electrodes 40a, 40b, 41a and 41b were then formed respectively. In order to form the contact holes 38a, 38b, 39a and 39b, the hole pattern was formed with the resist material and then thickened the resist pattern with the resist pattern thickening material according to the present invention, thereby forming fine space patterns (hole patterns). Thereafter, the contact holes were manufactured in accordance with a conventional method.

Thus, the FLASH EPROM as a semiconductor device was manufactured (FIG. 28).

In the above-manufactured FLASH EPROM, the second gate dielectric film 24b in the peripheral circuit unit (the right views in FIGS. 20 through 28) remains being covered by the first polysilicon film 28 or the gate electrode 28b after its formation (the right views in FIGS. 20 through 28) and thereby keeps its initial thickness. Accordingly, the thickness of the second gate dielectric film 24b can be easily controlled, and the concentration of a conductive dopant can be easily controlled for the control of the threshold voltage.

In this embodiment, the first gate unit 33a is formed by initially patterning in the gate width direction (the X direction in FIGS. 18 and 19) to a set width and then patterning in the gate length direction (the Y direction in FIGS. 18 and 19) to a target width. Alternatively, the first gate unit 33a may be formed by initially patterning in the gate length direction (the Y direction in FIGS. 18 and 19) to a set width and then patterning in the gate width direction (the X direction in FIGS. 18 and 19) to a target width.

Another FLASH EPROM was manufactured in the same way as in the above embodiment, except that the steps subsequent to the step of FIG. 28 were changed to those shown in FIGS. 29, 30 and 31. This manufacture is similar to the above embodiment, except for the followings. Specifically, a tungsten (W) film or a titanium (Ti) film about 200 nm (2,000 angstroms) thick was formed as a refractory metal film (fourth conductive film) 42 on the second polysilicon film 31 in the memory cell unit (the left and central views in FIG. 29) and the first polysilicon film 28 in the peripheral circuit unit (the right view in FIG. 29) and thereby yielded a polycide film. The steps of FIGS. 30 and 31 subsequent to the step of FIG. 29 were carried out in the same manner as in FIGS. 26, 27, and 28 and a detail description thereof is omitted. The same components in FIGS. 29, 30, and 31 as in FIGS. 26, 27, and 28 have the same reference numerals.

Thus, a FLASH EPROM as a semiconductor device was manufactured (FIG. 31).

The above-manufactured FLASH EPROM has the refractory metal films (fourth conductive films) 42a and 42b on the control gate electrode 31a and the gate electrode 28b and can thereby further reduce its electrical resistance.

In this embodiment, the refractory metal films 42a and 42b are used as the fourth conductive films. Alternatively, refractory metal silicide films such as titanium silicide (TiSi) films can be used.

Figure 32:
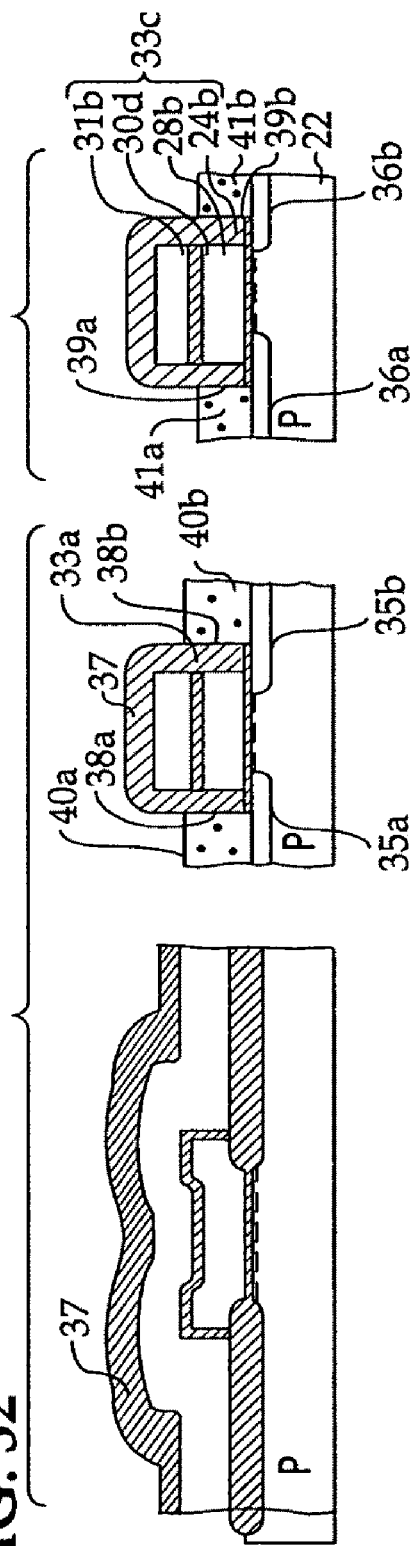
FIG. 32 is a cross-sectional schematic diagram for explaining the process for manufacturing the FLASH EPROM which is yet another example of the process for manufacturing a semiconductor device of the present invention.
Figure 33:
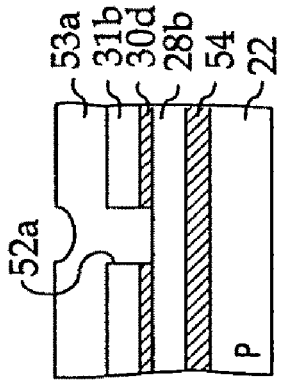
FIG. 33 is a cross-sectional schematic diagram for explaining the process for manufacturing the FLASH EPROM which is yet another example of the process for manufacturing a semiconductor device of the present invention, and showing a step after the step shown in FIG. 32.
Figure 34:
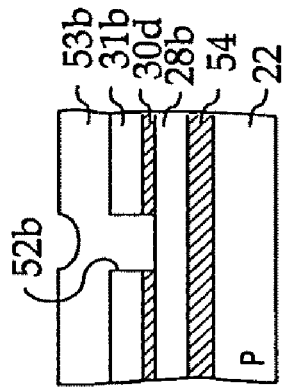
FIG. 34 is a cross-sectional schematic diagram for explaining the process for manufacturing the FLASH EPROM which is yet another example of the process for manufacturing a semiconductor device of the present invention, and showing a step after the step shown in FIG. 33.

Yet another FLASH EPROM was manufactured by the manufacture procedure as in the above-mentioned embodiment, except for steps shown in FIGS. 32, 33, and 34. Specifically, a second gate unit 33c in the peripheral circuit unit (second element region) (the right view in FIG. 32) has a multilayer structure comprising a first polysilicon film (first conductive film) 28b, a $SiO_2$ film (capacitor dielectric film) 30d, and a second polysilicon film (second conductive film)

31b arranged in this order as in the first gate unit 33a in the memory cell unit (the left and central views in FIG. 32). The first polysilicon film 28b and the second polysilicon film 31b are bridged and thereby form a gate electrode (FIGS. 33 and 34).

More specifically, with reference to FIG. 33, the first polysilicon film 28b and the second polysilicon film 31b are bridged by forming an opening 52a penetrating the first polysilicon film (first conductive film) 28b, the SiO₂ film (capacitor dielectric film) 30d and the second polysilicon film (second conductive film) 31b at another portion than the second gate unit 33c shown in FIG. 32, for example, on the dielectric film 54, and filling the opening 52a with a refractory metal film (third conductive film) 53a such as a W film or a Ti film. Alternatively, with reference to FIG. 34, the first polysilicon film 28b and the second polysilicon film 31b may be bridged by forming an opening 52b penetrating the first polysilicon film (first conductive film) 28b and the SiO₂ film (capacitor dielectric film) 30d, thereby exposing the lower first polysilicon film 28b at the bottom of the opening 52b, and filling the opening 52b with a refractory metal film 53b such as a W film or a Ti film.

In the above-manufactured FLASH EPROM, the second gate unit 33c in the peripheral circuit unit has the same structure as the first gate unit 33a in the memory cell unit. Accordingly, the memory cell unit and the peripheral circuit unit can be formed by the same step to thereby efficiently simplify steps of the manufacture process.

In this embodiment, the third conductive film 53a or 53b and the refractory metal film (fourth conductive film) 42 were formed independently. Alternatively, these films may be formed simultaneously as a refractory metal film in common.

Example 6

Manufacture of Magnetic Head

Example 6 relates to the manufacture of a magnetic head as an application embodiment of the resist pattern formed using the resist pattern thickening material of the present invention. In Example 6, after-mentioned resist patterns 102 and 126 are thickened resist patterns formed by the same process as in Example 1 using the resist pattern thickening material of the present invention.

FIGS. 35 through 38 show steps for the manufacture of the magnetic head.

Figure 35:
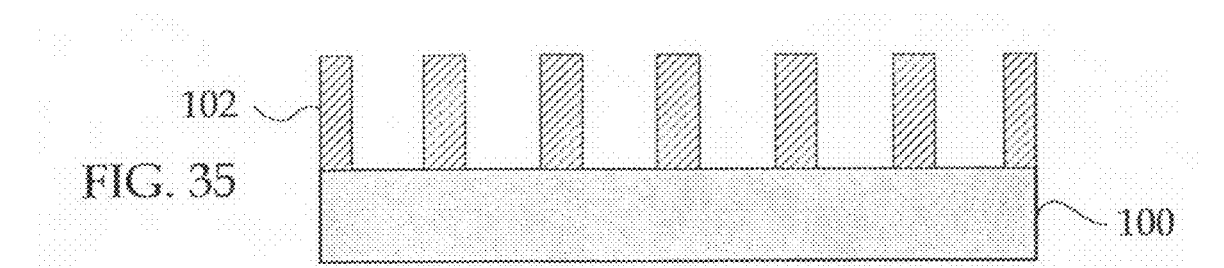
FIG. 35 is a cross-sectional schematic diagram for explaining an example in which a resist pattern, which has been thickened by using the resist pattern thickening material of the present invention, is applied to the manufacturing of a recording head.

Initially, a resist film was formed to a thickness of 6 μm on an interlayer dielectric layer 100, was exposed to light, was developed and thereby yielded a resist pattern 102 having an opening pattern for the formation of a spiral thin film magnetic coil (FIG. 35).

Figure 36:
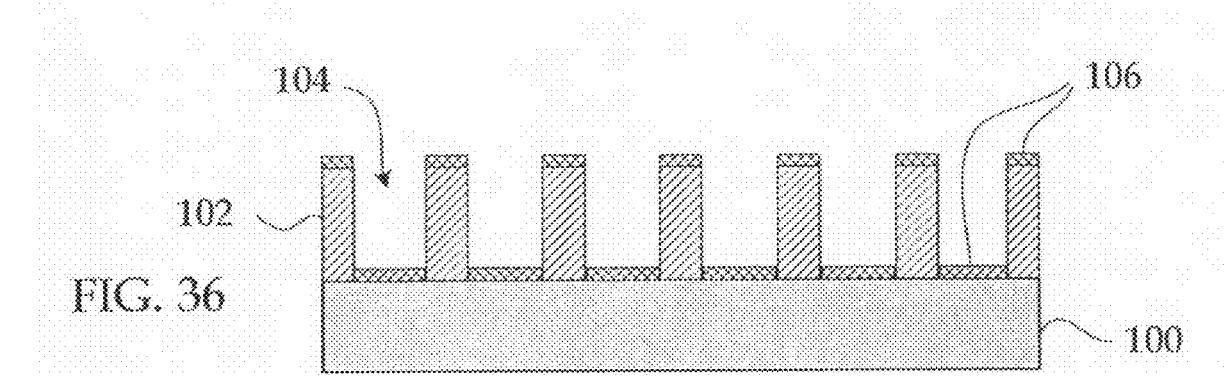
FIG. 36 is a cross-sectional schematic diagram for explaining an example in which a resist pattern, which has been thickened by using the resist pattern thickening material of the present invention, is applied to the manufacturing of a recording head, and showing a step after the step shown in FIG. 35.

Next, a plated underlayer 106 comprising a multilayer structure comprising a Ti contact film 0.01 μm thick and a Cu contact film 0.05 μm thick was formed by vapor deposition on the resist pattern 102 and on the exposed surface of the interlayer dielectric layer 100 at the bottom of the opening 104 in a portion where the resist pattern 102 was not formed (FIG. 36).

Figure 37:
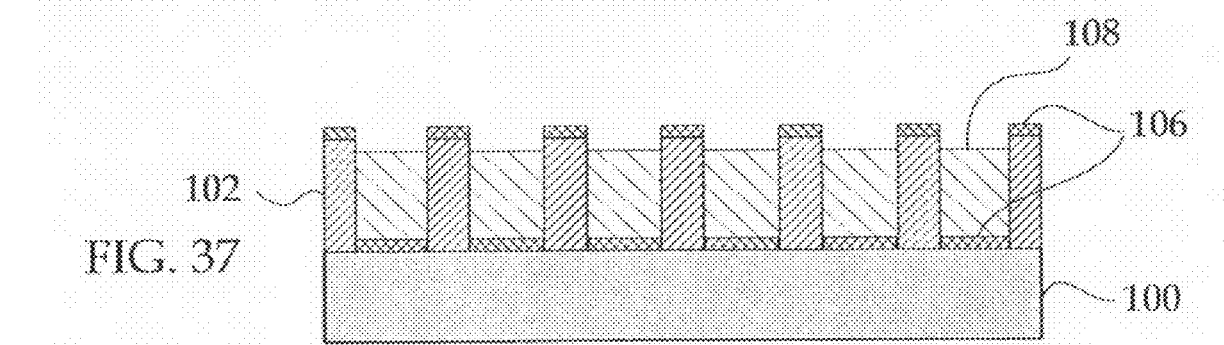
FIG. 37 is a cross-sectional schematic diagram for explaining an example in which a resist pattern, which has been thickened by using the resist pattern thickening material of the present invention, is applied to the manufacturing of a recording head, and showing a step after the step shown in FIG. 36.

A Cu-plated film 3 μm thick as a thin-film conductor 108 was formed on the surface of the plated underlayer 106 above the exposed surface of the interlayer dielectric layer 100 at the bottom of the opening 104 in a portion where the resist pattern 102 was not formed (FIG. 37).

Figure 38:
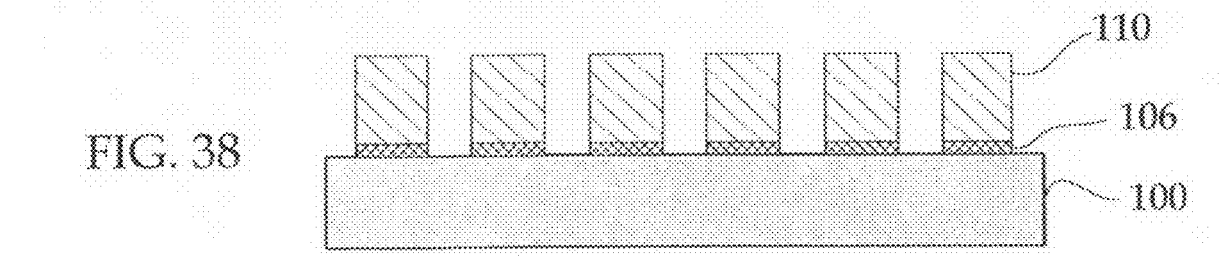
FIG. 38 is a cross-sectional schematic diagram for explaining an example in which a resist pattern, which has been thickened by using the resist pattern thickening material of the present invention, is applied to the manufacturing of a recording head, and showing a step after the step shown in FIG. 37.

The resist pattern 102 was dissolved, was removed by lift-off from the interlayer dielectric layer 100 and thereby yielded a spiral thin-film magnetic coil 110 derived from the spiral pattern of the thin-film conductor 108 (FIG. 38).

Thus, the magnetic head was manufactured.

The above-manufactured magnetic head has the thin film magnetic coil 110 with fine and precise dimensions, since the fine spiral pattern was formed by using the resist pattern 102 thickened using the resist pattern thickening material of the present invention. In addition, the magnetic head can be satisfactorily manufactured in mass production.

Another magnetic head was manufactured by steps shown in FIGS. 39 through 44.

Figure 39:
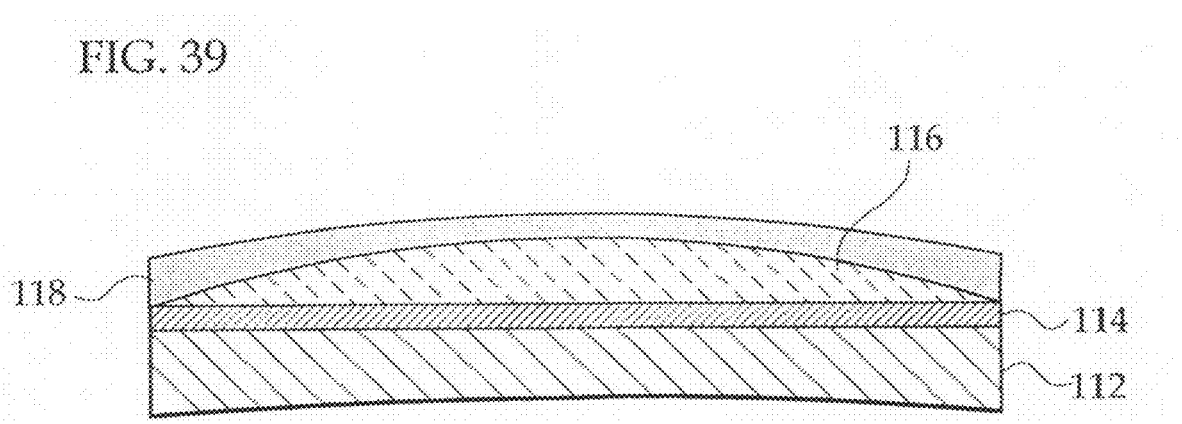
FIG. 39 is a cross-sectional schematic diagram for explaining an example in which a resist pattern, which has been thickened by using the resist pattern thickening material of the present invention, is applied to the manufacturing of a recording head, and showing a step after the step shown in FIG. 38.

A gap layer 114 was formed by sputtering so as to cover a ceramic non-magnetic substrate 112 (FIG. 39). The non-magnetic substrate 112 had an insulating layer of silicon oxide, a conductive underlayer of a Ni—Fe Permalloy formed by sputtering, and a lower magnetic layer of a Ni—Fe permalloy formed in advance on its surface. These layers are not shown in the figures. A resin dielectric film 116 was formed from a thermosetting resin in a set region on the gap layer 114 except a region to be a magnetic tip (magnetic head) of the lower magnetic layer (not shown). A resist composition was then applied to the resin dielectric film 116 and thereby yielded a resist film 118.

Figure 40:
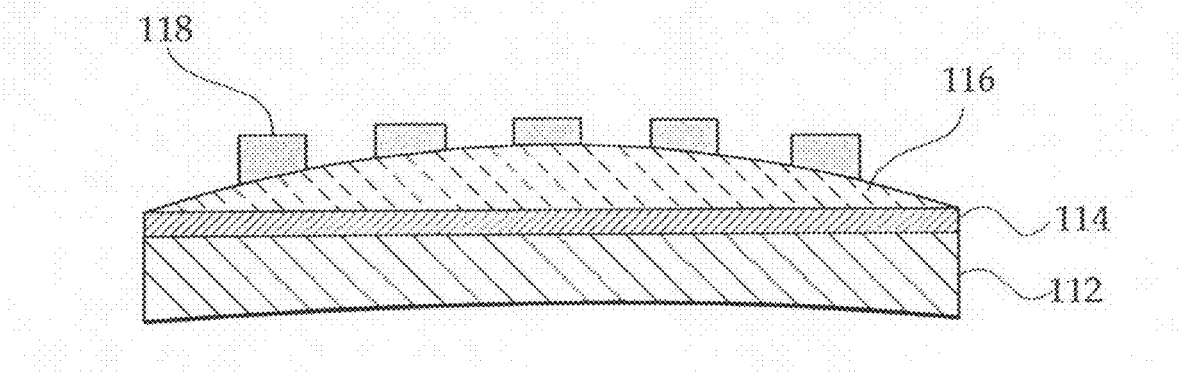
FIG. 40 is a cross-sectional schematic diagram for explaining an example in which a resist pattern, which has been thickened by using the resist pattern thickening material of the present invention, is applied to the manufacturing of a recording head, and showing a step after the step shown in FIG. 39.
Figure 41:
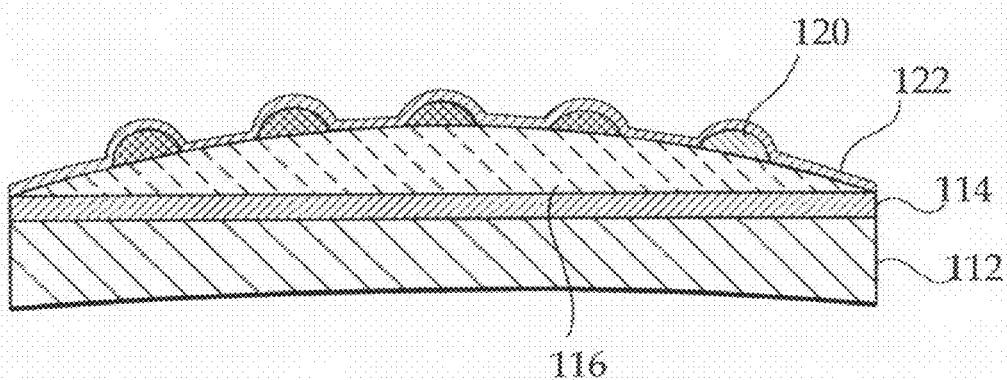
FIG. 41 is a cross-sectional schematic diagram for explaining an example in which a resist pattern, which has been thickened by using the resist pattern thickening material of the present invention, is applied to the manufacturing of a recording head, and showing a step after the step shown in FIG. 40.

The resist film 118 was exposed to light, was developed and thereby yielded a spiral pattern (FIG. 40). The spirally patterned resist film 118 was subjected to thermal curing at several hundred Celsius degrees for about one hour and thereby yielded a protruded first spiral pattern 120 (FIG. 41). A conductive workpiece surface 122 of Cu was formed so as to cover the surface of the first spiral pattern 120.

Figure 42:
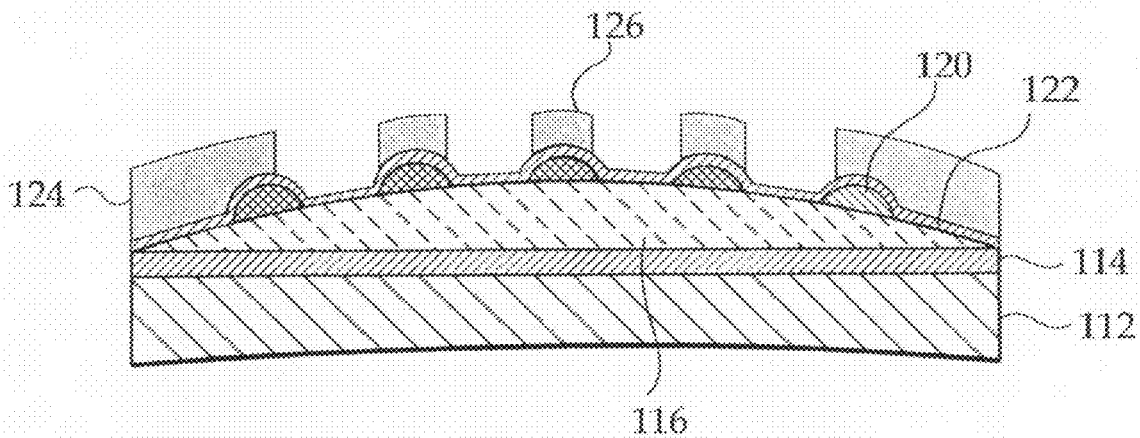
FIG. 42 is a cross-sectional schematic diagram for explaining an example in which a resist pattern, which has been thickened by using the resist pattern thickening material of the present invention, is applied to the manufacturing of a recording head, and showing a step after the step shown in FIG. 41.

A resist material was applied to the conductive workpiece surface 122 by spin coating and thereby yielded a resist film 124 thereon. Subsequently, the resist film 124 was patterned corresponding to the first spiral pattern 120 and thereby yielded a resist pattern 126 (FIG. 42).

Figure 43:
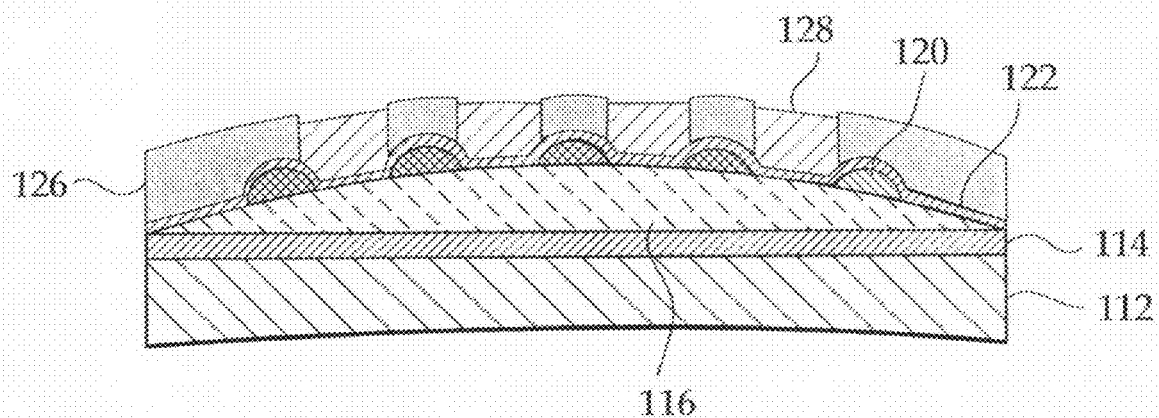
FIG. 43 is a cross-sectional schematic diagram for explaining an example in which a resist pattern, which has been thickened by using the resist pattern thickening material of the present invention, is applied to the manufacturing of a recording head, and showing a step after the step shown in FIG. 42.
Figure 44:
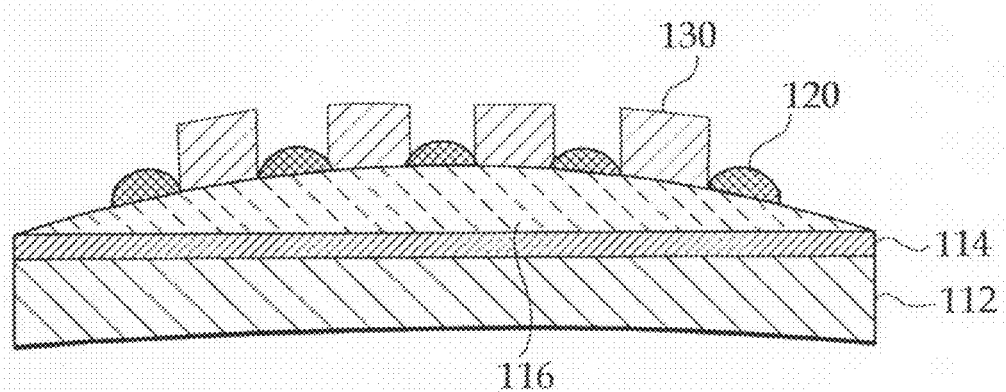
FIG. 44 is a cross-sectional schematic diagram for explaining an example in which a resist pattern, which has been thickened by using the resist pattern thickening material of the present invention, is applied to the manufacturing of a recording head, and showing a step after the step shown in FIG. 43.

A Cu conductive layer 128 was formed by plating on the exposed surface of the conductive workpiece surface 122 in a portion where the resist pattern 126 was not formed (FIG. 43). The resist pattern 126 was lifted off from the conductive workpiece surface 122 by dissolving and thereby yielded a spiral thin-film magnetic coil 130 derived from the Cu conductive layer 128 (FIG. 44).

Figure 45:
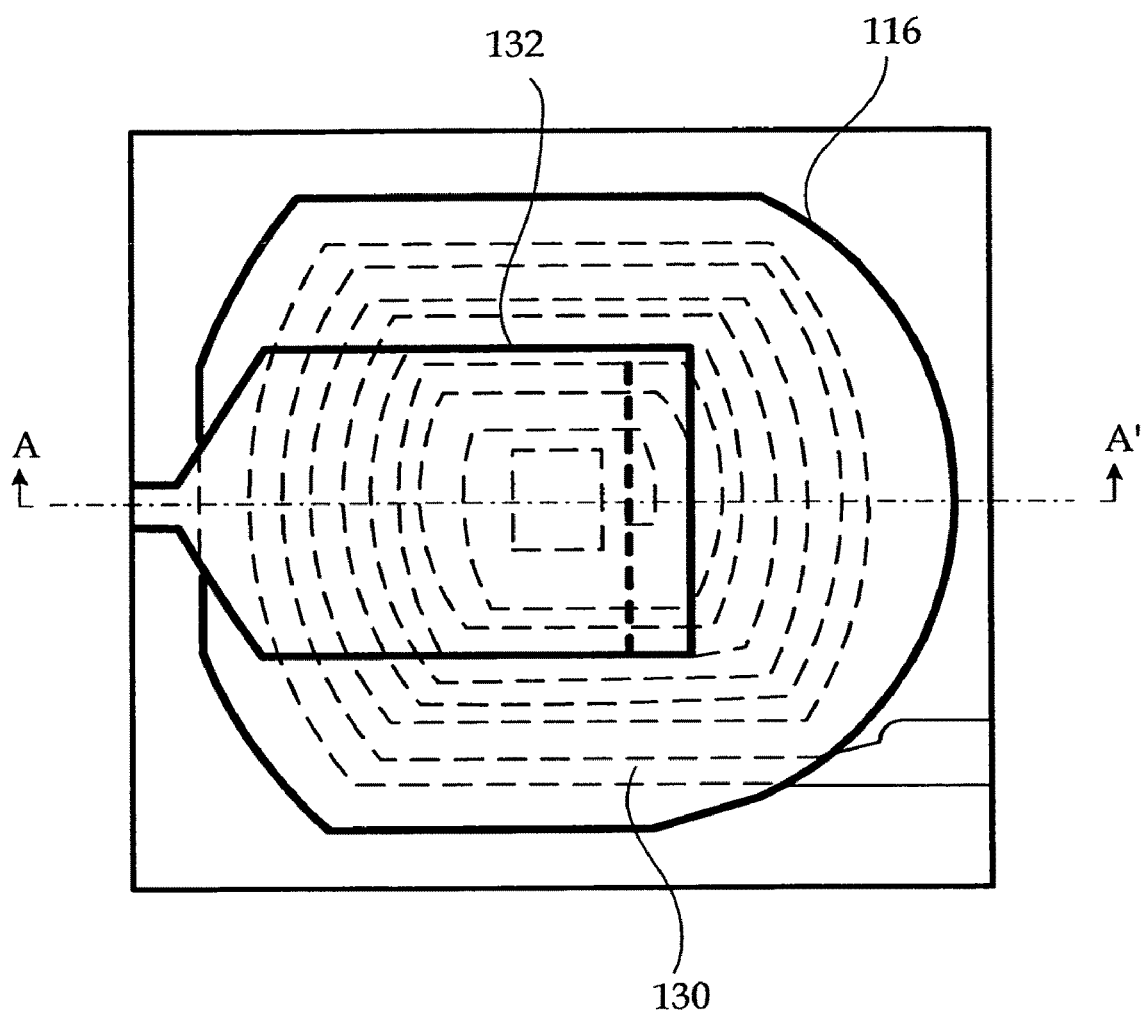
FIG. 45 is a plan view showing an example of the recording head manufactured by the steps of FIGS. 35 through 44.

Thus, the magnetic head as shown in a plan view of FIG. 45 was manufactured. The magnetic head has a magnetic layer 132 on the resin dielectric film 116 with the thin-film magnetic coil 130 on its surface.

The above-manufactured magnetic head has the thin-film magnetic coil 130 with fine and precise dimensions, since the fine spiral pattern was formed by using the resist pattern 126 thickened by the resist pattern thickening material of the present invention. In addition, the magnetic head can be satisfactorily manufactured in mass production.

The present invention can solve the conventional problems and achieve the above-mentioned objects.

The present invention can provide a resist pattern thickening material, which can utilize ArF excimer laser light as exposure light during patterning; which, when applied over a resist pattern to be thickened, can efficiently thicken the resist pattern to be thickened, e.g., in form of line-space pattern, regardless of the size of the resist pattern to be thickened; which has high etch resistance; and which is suited for forming a fine space pattern of resist, exceeding exposure limits or resolution limits of light sources of available exposure devices at low cost, easily and efficiently.

The present invention can also provide a process for forming a resist pattern which, during patterning a resist pattern to be thickened, can utilize ArF excimer laser light as a light source; which can thicken a resist pattern to be thickened, e.g., in form of line-space pattern, regardless of the size of the resist pattern; and which is suited for forming a fine space pattern of resist, exceeding exposure limits or resolution limits of light sources of available exposure devices at low cost, easily and efficiently.

In addition, the present invention can provide a process for manufacturing a semiconductor device in which, during patterning a resist pattern to be thickened, ArF excimer laser light can be utilized as a light source; a fine space pattern of resist, exceeding exposure limits or resolution limits of light sources of available exposure devices, can be formed; and high-performance semiconductor devices having fine wiring patterns formed by using the space pattern of resist can be efficiently mass produced, and is to provide a high-performance semiconductor which is manufactured by the process for manufacturing a semiconductor device and has fine wiring patterns.

The resist pattern thickening material of the present invention is suitably utilized for thickening a resist pattern formed of ArF resist or the like and for forming patterns, i.e., space pattern of resist, or wiring pattern finely, exceeding the exposure limits or resolutions of light sources of available exposure devices, while using light as a radiation source during patterning. Thus the resist pattern thickening material of the present invention is suitably applicable for a variety of patterning method, semiconductor device manufacturing process, etc. and particularly suitably applicable for a process for forming a resist pattern and process for manufacturing a semiconductor device of the present invention.

The process for forming a resist pattern of the present invention is suitably applicable for manufacturing functional parts such as mask patterns, reticle patterns, magnetic heads, LCDs (liquid crystal displays), PDPs (plasma display panels), SAW filters (surface acoustic wave filters); optical parts used in connecting optical wiring; fine parts such as microactuators; semiconductor devices; and the like, and can be suitably employed in the process for manufacturing a semiconductor device of the present invention.

The process for manufacturing a semiconductor device of the present invention is suitably applicable for a manufacturing procedure of various semiconductor devices, such as flash memory, DRAM, FRAM and the like.

What is claimed is:

1. A resist pattern thickening material comprising:
   a resin; and
   a compound represented by the general formula (1):

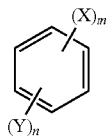

General Formula (1)

where, "X" is a functional group represented by the following structural formula (1), "Y" represents at least any one of a hydroxyl group, an amino group, an amino group substituted by an alkyl group, an alkoxy group, an alkoxycarbonyl group and an alkyl group, and the number of the substitution is an integer of 0 to 3, "m" represents an integer of 1 or more and "n" represents an integer of 0 or more:

Structural Formula (1)

where, "$R^1$" and "$R^2$" may be the same or different, and each represent a hydrogen atom or a substituent group, "Z" represents at least any one of a hydroxyl group, an amino group, an amino group substituted by an alkyl group, and an alkoxy group, and the number of the substitution is an integer of 0 to 3 wherein the resist pattern thickening material does not occur a crosslinking reaction.

2. A resist pattern thickening material according to claim 1, wherein the resist pattern thickening material exhibits at least one of water-solubility and alkali-solubility.

3. A resist pattern thickening material according to claim 1, wherein the "m" in the general formula (1) is 1.

4. A resist pattern thickening material according to claim 1, wherein the "$R^1$" and "$R^2$" are each a hydrogen atom.

5. A resist pattern thickening material according to claim 1, wherein the compound represented by the general formula (1) comprises one of a benzyl alcohol structure and a benzylamine structure.

6. A resist pattern thickening material according to claim 1, wherein the content of the compound represented by the general formula (1) in the resist pattern thickening material is 0.01 parts by mass to 50 parts by mass on the total amount of the resist pattern thickening material.

7. A resist pattern thickening material according to claim 1, wherein the resin exhibits at least one of water-solubility and alkali-solubility.

8. A resist pattern thickening material according to claim 1, wherein the resin is at least one selected from the group consisting of polyvinyl alcohol, polyvinyl acetal, and polyvinyl acetate.

9. A resist pattern thickening material according to claim 1, further comprising a surfactant.

10. A process for forming a resist pattern comprising:
    forming a resist pattern to be thickened; and then
    applying a resist pattern thickening material so as to cover the surface of the resist pattern to be thickened without causing a crosslinking reaction,
    wherein the resist pattern thickening material comprises:
    a resin; and
    a compound represented by the general formula (1):

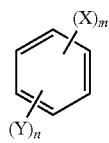

General Formula (1)

where, "X" is a functional group represented by the following structural formula (1), "Y" represents at least any one of a hydroxyl group, an amino group, an amino group substituted by an alkyl group, an alkoxy group, an alkoxycarbonyl group and an alkyl group, and the number of the substitution is an integer of 0 to 3, "m" represents an integer of 1 or more and "n" represents an integer of 0 or more:

Structural Formula (1)

where, "$R^1$" and "$R^2$" may be the same or different, and each represent a hydrogen atom or a substituent group, "Z" represents at least any one of a hydroxyl group, an amino group, an amino group substituted by an alkyl group, and an alkoxy group, and the number of the substitution is an integer of 0 to 3.

11. A process for forming a resist pattern according to claim 10, further comprising irradiating the entire surface of the resist pattern to be thickened with one of ultraviolet light or ionizing radiation before the application of a resist pattern thickening material.

12. A process for forming a resist pattern according to claim 11, wherein the ultraviolet light and ionizing radiation are at least one selected from the group consisting of g-line, i-line, KrF excimer laser light, ArF excimer laser light, $F_2$ excimer laser light, EUV light, electron beam, and X-ray.

13. A process for forming a resist pattern according to claim 10, wherein the resist pattern to be thickened comprises at least one of an ArF resist and a resist containing an acrylic resin.

14. A process for forming a resist pattern according to claim 13, wherein the ArF resist is at least one selected from the group consisting of acrylic resists having an alicyclic group at a side chain thereof, cycloolefin-maleic acid anhydrate resists and cycloolefin resists.

15. A process for forming a resist pattern according to claim 10, wherein, after the application of a resist pattern thickening material, developing processing of the resist pattern thickening material is carried out.

16. A process for forming a resist pattern according to claim 15, wherein the developing processing is carried out using at least one of water, an alkaline developing solution, water containing a surfactant, and an alkaline developing solution containing a surfactant.

17. A process for forming a resist pattern according to claim 16, wherein the surfactant is at least one selected from the group consisting of a polyoxyethylene-polyoxypropylene condensation compound, a polyoxyalkylene alkyl ether compound, a polyoxyethylene alkyl ether compound, a polyoxyethylene derivative compound, a silicone compound, a sorbitan fatty acid ester compound, a glycerine fatty acid ester compound, an alcohol ethoxylate compound, and a phenol ethoxylate compound.

18. A process for forming a resist pattern according to claim 16, wherein the content of the surfactant to one of the water and the alkaline developing solution is 0.001% by mass to 1% by mass.

19. A process for manufacturing a semiconductor device, comprising the steps of:
   forming a thickened resist pattern on a surface of a workpiece using a process for forming a resist pattern; and
   patterning the surface of the workpiece by etching the surface of the workpiece using the thickened resist pattern as a mask,
wherein the process for forming a resist pattern comprises forming a resist pattern to be thickened; and then
applying a resist pattern thickening material so as to cover the surface of the resist pattern to be thickened without causing a crosslinking reaction,
wherein the resist pattern thickening material comprises:
   a resin; and
   a compound represented by the general formula (1):

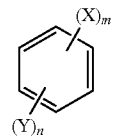

General Formula (1)

where, "X" is a functional group represented by the following structural formula (1), "Y" represents at least any one of a hydroxyl group, an amino group, an amino group substituted by an alkyl group, an alkoxy group, an alkoxycarbonyl group and an alkyl group, and the number of the substitution is an integer of 0 to 3, "m" represents an integer of 1 or more and "n" represents an integer of 0 or more:

Structural Formula (1)

where, "$R^1$" and "$R^2$" may be the same or different, and each represent a hydrogen atom or a substituent group, and "Z" represents at least any one of a hydroxyl group, an amino group, an amino group substituted by an alkyl group, and an alkoxy group, and the number of the substitution is an integer of 0 to 3.

20. A resist pattern thickening material comprising:
a resin; and
a compound selected from the group consisting of 4-hydroxybenxyl alcohol, 2,4-dihydroxybenzyl alcohol, 1,4-benzenedimethanol, 1-phenyl-1,2-ethanedithiol and 4-methoxymethylphenol.

21. A resist pattern thickening material according to claim 20, wherein the resist pattern thickening material exhibits at least one of water-solubility and alkali-solubility.

22. A resist pattern thickening material according to claim 20, wherein the resin exhibits at least one of water-solubility and alkali-solubility.

23. A resist pattern thickening material according to claim 20, wherein the resin is at least one selected from the group consisting of polyvinyl alcohol, polyvinyl acetal, and polyvinyl acetate.

24. A resist pattern thickening material according to claim 20, further comprising a surfactant.

* * * * *